(12) United States Patent  
Takemura et al.

(10) Patent No.: US 6,925,017 B2  
(45) Date of Patent: Aug. 2, 2005

(54) SEMICONDUCTOR DEVICE

(75) Inventors: Riichiro Takemura, Tokyo (JP); Tomonori Sekiguchi, Tama (JP); Takeshi Sakata, Hino (JP); Shinichi Miyatake, Ome (JP); Hiromasa Noda, Tokyo (JP); Kazuhiko Kajigaya, Iruma (JP)

(73) Assignees: Hitachi, Ltd., Tokyo (JP); Elpida Memory, Inc., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 45 days.

(21) Appl. No.: 10/701,511

(22) Filed: Nov. 6, 2003

(65) Prior Publication Data

US 2004/0124440 A1 Jul. 1, 2004

(30) Foreign Application Priority Data

Nov. 8, 2000 (JP) ..................... 2002-324644  
Oct. 31, 2003 (JP) ..................... 2003-373026

(51) Int. Cl.[7] .......................................... G11C 7/00  
(52) U.S. Cl. .................. 365/196; 365/207; 365/233  
(58) Field of Search ........................... 365/196, 189.01, 365/207, 233, 189.04

(56) References Cited

U.S. PATENT DOCUMENTS

2002/0093864 A1 * 7/2002 Ooishi ..................... 365/222

2003/0002315 A1 * 1/2003 Ooishi ..................... 365/63

FOREIGN PATENT DOCUMENTS

JP 2001-256782 9/2001

OTHER PUBLICATIONS

"WP 24.1 An 8ns Random Cycle Embedded RAM Macro with Dual–Port Interleaved DRAM Architecture ($D^2RAM$)", 2000 IEEE International Solid–State Circuits Conference, 07803–5853–Aug. 2000.

* cited by examiner

*Primary Examiner*—Thong Q. Le  
(74) *Attorney, Agent, or Firm*—Mattingly, Stanger, Malur & Brundidge, P.C.

(57) ABSTRACT

A column select line YS1 can be enabled at the same time as the enabling of a word line. Write data is written from an I/O gate into a selected data line. An adjacent unselected sense amplifier reads data from memory cells. A source node of a cross-coupled sense amplifier connected to each data line pair is divided for each column select line, thereby to prevent a write-selected cross-coupled amplifier from driving the source node. In the write operation, data can be written at a high speed. On the other hand, it becomes possible to prevent a write-sense amplifier from driving the source node. Therefore, adjacent sense amplifiers can achieve stable read operation without being affected from the write-sense amplifier.

26 Claims, 21 Drawing Sheets

SEMICONDUCTOR DEVICE

TECHNICAL FIELD OF THE INVENTION

The present invention relates to a semiconductor device. Particularly, the present invention relates to a differential amplifier circuit arrangement for this semiconductor device, and a data writing system.

BACKGROUND OF THE INVENTION

In order to realize a high-speed cycle using a DRAM (Dynamic Random Access Memory), it is necessary to increase the speed of the write cycle. In the DRAM for a destructive read operation, when the write operation is carried out, a rewrite operation needs to be done in a write-selected cell of the same word line, as well. Usually, the write operation is carried out as follows. Once the data in the memory cell is read out to a sense amplifier and after amplification to a certain degree and carrying out a rewrite operation, new data is written into the sense amplifier from an input/output (I/O) line. Therefore, in writing an opposite data, the amplified data needs to be inverted to a certain level, and then amplified, which results in an increase in the write time. In order to speed up the write operation, a "Write before Sense" system is disclosed in the International Solid-State Circuits Conference 2000 WP24-1. According to this system, in reading data from a memory cell, new data is written into a selected sense amplifier. As the data is written before the amplification, a high-speed write operation can be realized.

SUMMARY OF THE INVENTION

A conventional sense amplifier circuit has such an arrangement that source nodes of NMOS and PMOS of a cross-coupled amplifier CC are connected to common source line NCS and PCS respectively as shown in FIG. 20. However, when the above operation is carried out in this circuit arrangement, there is a problem that a write-selected sense amplifier drives an unselected sense amplifier as described below. FIG. 21 is an operation waveform diagram when the write before sense operation is carried out in the sense amplifier according to the conventional system as shown in FIG. 20. A word line WL and a column select line YS23 are selected. New data is written into data line pair DL2t/b and DL3t/b before the amplification. Then, the amplitudes of a write selected data line pair DL2t/b and DL3t/b shift as follows. That is, a low level side shifts to a ground level VSS, and a high level side shifts from a high voltage level VDL to a voltage level VDL−Vth that is after a fall of a threshold value Vth of the I/O gate. The data line pair is driven in a write buffer for driving the I/O line as explained above. With this arrangement, via the cross coupled transistor, the source line PCS of the cross-coupled amplifier CC is driven from the high voltage level VDL to the voltage level VDL−Vth that is after a fall of the threshold value Vth of the I/O gate. The NMOS common source line NCS is driven to VSS. On the other hand, in the unselected sense amplifier, the data of the memory cell is being read, and no signal data that can bear an accurate amplification operation is not read out. Therefore, when the common source line is driven at this stage, the sense amplifier is enabled and is set in a pre-sensing operation, which has a risk of amplifying error data.

Further, in a two-cell/bit array of storing complementary data of one bit using two cells, there is a possibility that the same data is written into two cells when the power source is turned on. When this cells are read out in a data line pair, a signal that is input to the cross couple is 0V. This results in an undefined state, and penetrating current flows. In the worst case, when this penetrating current flows through all the data line pairs on one word line, the power source voltage is lowered, resulting in an unstable operation. Particularly, at the initial stage, the power source voltage is lowered due to the penetrating current, resulting in a reduction in the common source voltage. This makes it impossible to initialize the memory cell. Further, a variation in the power supply to the peripheral circuit has a risk of bringing about an erroneous operation.

It is an object of the present invention to provide a sense amplifier structure that eliminates the influence of interference to an unselected sense amplifier due to the operation of a write-selected amplifier in the high-speed write operation, and that realizes a high-speed writing, and stable reading, sensing, and rewrite operation, and is also an object of eliminating an unstable operation in a two cell/bit array.

In a DRAM for writing data into a sense amplifier before enabling the sense amplifier, the source node of the sense amplifier is shared in a sense amplifier that is selected at the same time as the writing. In a sense amplifier having a direct sense, the source node of the direct sense is shared in only a sense amplifier that is selected at the same time as the writing.

BRIEF DESCRIPTIONS OF THE DRAWINGS

DESCRIPTION OF THE PREFERRED EMBODIMENTS

Embodiments of the present invention will be explained in detail below with reference to the accompanying drawings. A circuit element that constitutes each block in the embodiments is formed on one semiconductor substrate such as monocrystalline silicon according to an integrated circuit technique like a known CMOS (complementary MOS transistor). A circuit symbol having no arrow mark for a MOSFET (Metal Oxide Semiconductor Field Effect Transistor) represents an N-type MOSFET (NMOS), and a circuit symbol having an arrow mark represents a P-type MOSFET (PMOS). The MOSFET will hereinafter be called a MOS. In the present invention, an open data-line arrangement and a folded data-line arrangement have similar effects as a memory array arrangement. There is no limit to the data line arrangement. The folded data-line arrangement according to the present invention will be explained below. A "1T1C" type memory cell having one memory cell consisting of one capacitor for one transistor is mainly explained. However, the memory cell is not limited, and the present invention can also be applied to a three-transistor type memory cell or the like.

Figure 1:
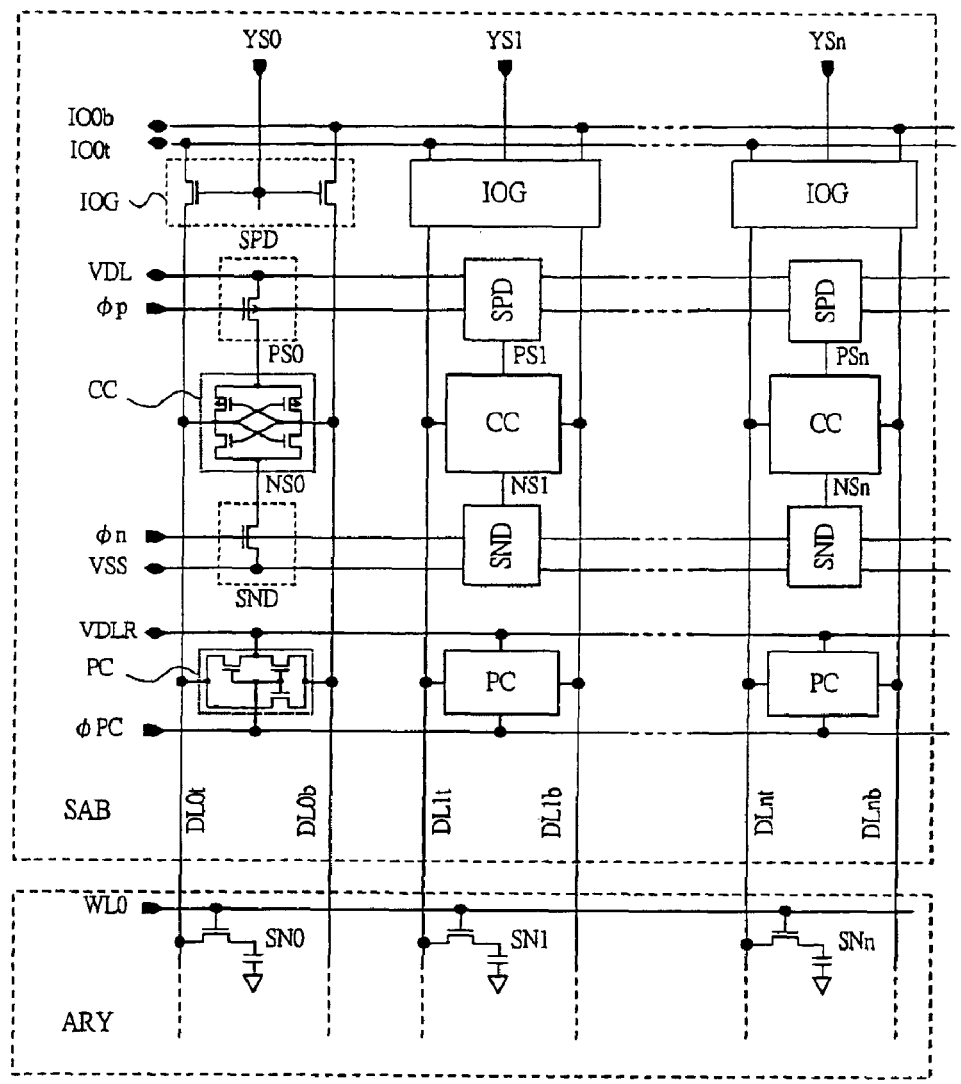
FIG. 1 is a configuration diagram of a sense amplifier block and a periphery thereof according to the first embodiment of the present invention.

The first embodiment of the present invention will be explained with reference to FIG. 1. FIG. 1 illustrates a DRAM memory array ARY and a part of a sense amplifier block SAB as a peripheral circuit block thereof to which the present invention is applied. In the sense amplifier SAB, a cross coupled amplifier CC as a positive-feedback amplifier, an I/O gate IOG, and a precharge circuit PC are connected to data line pairs DL0t/b, DL1t/b, . . . , and DLnt/b respectively. The cross coupled amplifier CC amplifies a voltage to a desired level according to a positive feedback based on fine signals read from the memory cell into the data line pairs DL0t/b, DL1t/b, . . . , and DLnt/b. The cross coupled amplifier CC comprises a pair of NMOSs having a common source and having respective gates and drains connected to each other, and a pair of PMOSs having a common source and having respective gates and drains connected to each other. NMOS common sources NS0, NS1, etc. of the cross-coupled amplifiers CC are isolated by each cross-coupled amplifiers CC. Similarly, PMOS common sources PS0, PS1, etc. of the cross-coupled amplifier CC are isolated by each cross-coupled amplifiers CC. An NMOS sense driver SND and a PMOS sense driver SPD that enable the sense amplifier are connected to respective source nodes NS0, NS1, etc. and PS0, PS1, etc. The NMOS sense driver SND drives the source nodes NS0, NS1, etc. to a voltage level VSS according to a sense amplifier enable signal φn. The PMOS sense driver SPD drives the source nodes PS0, PS1, etc. to an array operation voltage VDL as a data-line swing voltage according to the sense amplifier enable signal φp. While the PMOS is used in the drawing, the NMOS can also used for the construction. In this case, the logic of the enable signal φp is inverted. The I/O gate IOG is a switch that connects the data line pairs DLnt/b (n=0, 1, 2, . . . ) with the I/O line pair IOt/b, and is controlled according to column select lines YS0, YS1, . . . , and YSn. The column select line is output from a decoder that selects a data line. The data line precharge circuit PC sets the data line pair to a desired level, that is, a data line precharge voltage VDLR as one half of the data-line swing voltage, when the memory array is in the standby, according to a precharge control signal φPC. The data line precharge circuit PC comprises a switch that short-circuits between the data line pairs and a switch that connects the data line to the voltage VDLR.

Figure 13A:
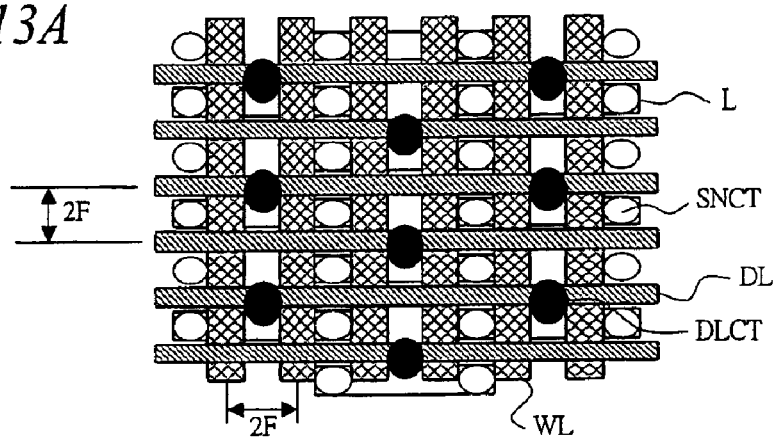
FIG. 13A is an illustration of a layout of a memory array.
Figure 13B:
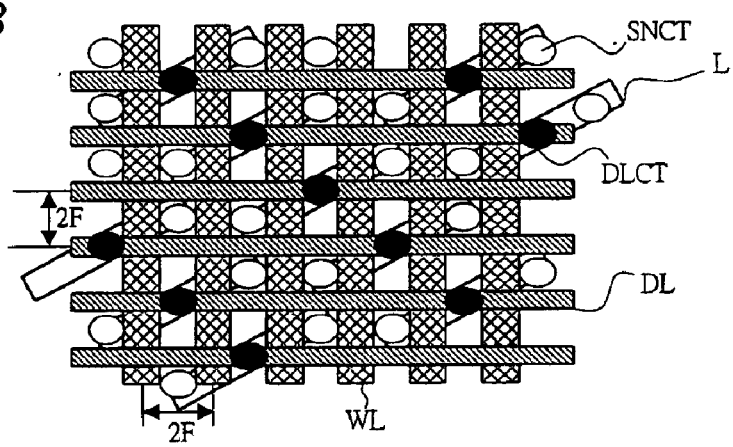
FIG. 13B is an illustration of a layout of a memory array.
Figure 13C:
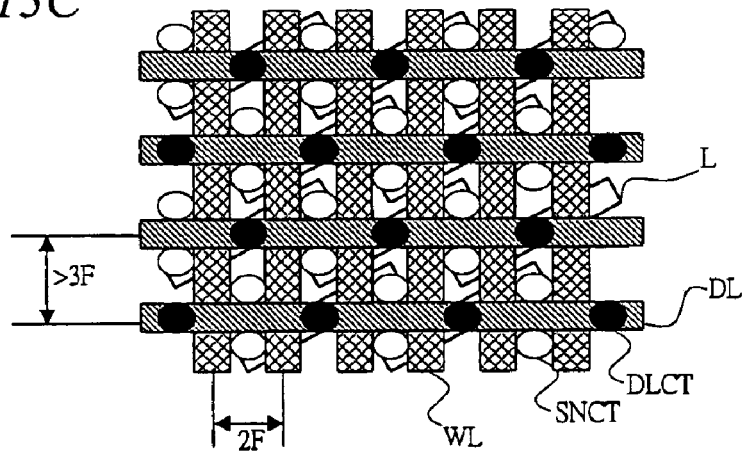
FIG. 13C is an illustration of a layout of a memory array.

FIG. 13 is an illustration of a layout of the memory array ARY to which the present sense amplifier block is applied. In the drawing, F represents a feature size, which is defined as one half of the word line pitch. A storage node contact SNCT is a contact hole for connecting a diffusion layer L of the memory cell transistor with a storage node capacitor. A data line contact DLCT is a contact hole for connecting the diffusion layer L of the memory cell transistor with a data line DL. FIG. 13A illustrates a folded array. Both the data line and the word line are wired at a pitch of two times the feature size F. When viewed from the data line side, a memory cell is connected at every two word lines. FIG. 13B illustrates a quarter pitched array. A diffusion layer is inclined to the data line. In the present arrangement, both the data line and the word line are wired at a pitch of two times the feature size F. FIG. 13C illustrates an open data line arrangement array. In the present layout, the data line pitch is about three times the feature size F. The word line is wired at a pitch of two times the feature size F. A memory cell is disposed at all crossings between the data line and the word line. In the layout shown in FIG. 13A and FIG. 13B, a minimum value of the memory cell area is $8F^2$. However, the layout shown in FIG. 13C has an advantage in that the memory cell area can be reduced to about $6F^2$.

Figure 14A:
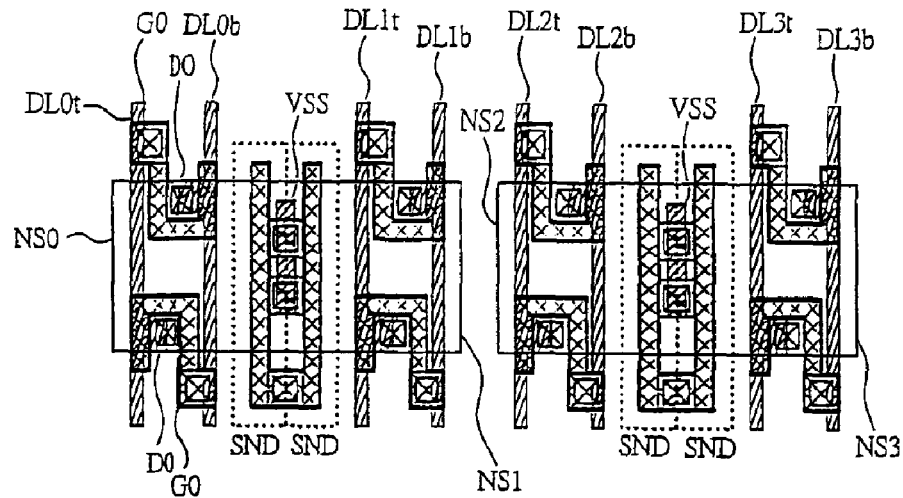
FIG. 14A is an illustration of a layout of a cross-coupled portion.

FIG. 14A is a layout diagram of the NMOS portion of the cross-coupled amplifier CC according to the present invention. The data line pair has two upper and lower U-shaped character gates G1 and G2 wired with a metal one layer 1, and is connected to drain side D1 and D0 having three directions surrounded with a gate and gates G0 and G1 surrounding the other drain. By providing the gates in a U-shape, a transistor gate width can be taken large in a small area, and the metal one layer on the cross couple can be laid out in a straight line, which prevents the occurrence of line disconnection and short-circuit. The data line pair is isolated from the adjacent cross-coupled source node with a sense amplifier drive at one side and with a diffusion layer at the other side. The NMOS source node of the cross-coupled amplifier CC and the drain of the sense amplifier driver SND are connected to each other with the diffusion layer. One side of the source node NS0 of the cross-coupled amplifier CC is isolated by an SGI (shallow grove isolation) that is formed by embedding an insulator into a groove between diffusion layers. The other side of the source node NS0 of the cross-coupled amplifier CC is isolated from the adjacent cross-coupled amplifier CC by the sense driver SND. The sense driver SND is disposed at two positions outside the data line pairs DL0t/b and DL1t/b respectively. The source of the sense amplifier driver SND for the data line pair DL0t/b shares the diffusion layer with the source of the sense amplifier driver SND for the data line pair DL1t/b.

Figure 2:
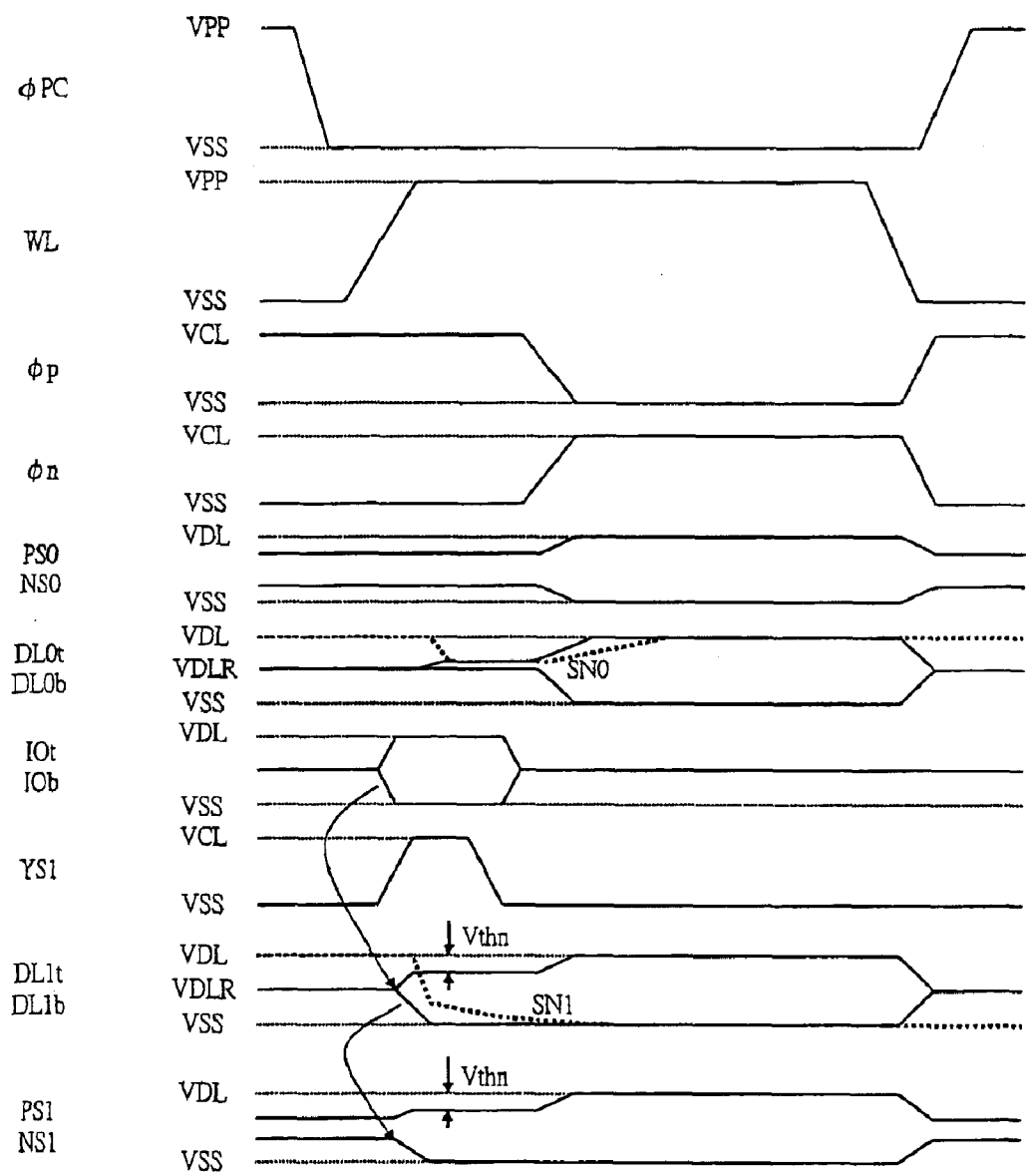
FIG. 2 is an operation waveform diagram according to the first embodiment.

The write operation of the circuit arrangement will be explained with reference to FIG. 2. "H" data is written into a write-selected storage node SN1 in advance. "L" data is written in the write operation. An address is transferred to a memory array at the same time as the write command. Following the transferred address, a precharge signal φPC of a specific sense amplifier block SAB shifts from a supply voltage VCL for peripheral circuit or a boosted voltage VPP for word line at a high voltage level to an unselected level VSS. Thereafter, a word line WL corresponding to the transferred address shifts to the boosted voltage VPP as the selected level. A column select line YS1 corresponding to the address transferred at the same time as the word line or before or after the word line shifts to the supply voltage VCL for peripheral circuit as the selected level. Accordingly, the data line pair DL1t/b is connected to the I/O line IOt/b. At this time, the write data to the memory cell is transferred to the data line pair DL1t/b by a write buffer that drives the I/O line IOt/b. Data irrelevant to the data written in the storage node SN1 is written into the data line pair. In this case, when the "L" data is written into the data line pair DL1t/b and also when the "L" data is written into the storage node SN1, data at a low voltage level VSS is written into the data line DL1t/b from the I/O line IOt/b. At the same time, data is written from the I/O line IOt/b into the data line DL1b at a voltage (VDL−Vthn) that is lower than the high voltage level VDL, by the threshold voltage Vthn of the NMOS transistor of the I/O gate IOG. When the data line pair has the amplitude smaller than the array operation voltage VDL by the threshold voltage Vth, the voltage between the NMOS source node NS01 and the PMOS source node PSO1 becomes the level smaller than the array operation voltage VDL by the threshold voltage Vth. In the present arrangement, the source node of the cross-coupled amplifier CC is isolated by each cross-coupled amplifier. Therefore, the voltage between the source nodes of the cross-coupled amplifier CC not selected by the adjacent column select line holds the amplitude at the precharge time, which does not bring about a pre-sensing operation. Consequently, the write-unselected sense amplifier can accurately carry out the read operation. When the "L" data is written into the unselected cell SN0, and also when the read data is written again into the memory cells SN0, SN2, etc. of the write-unselected data line, the word line is set to the unselected level VSS. Thereafter, the precharge control signal φPC is set to the high voltage level VCL or the boosted voltage VPP, and the data line pair is precharged. The levels of the NMOS source nodes NS0, NS1, etc. are boosted to a level lower than the data line precharge level by the threshold voltage of the NMOS of the cross-coupled amplifier CC. Similarly, the PMOS source nodes PS0, PS1, etc. are boosted to a level higher than the data line precharge level VDLR by the threshold voltage of the PMOS of the cross-coupled amplifier CC.

Advantages of the present arrangement will be explained next. (1) As data is written at the same time as the reading of data from the memory cell, a high-speed write operation becomes possible. (2) A pre-sensing operation can be prevented in the adjacent cross-coupled circuit at the write time, and a stable read operation can be realized. In the present embodiment, while one sense amplifier is selected for one column select line, the number of sense amplifiers that are selected according to one column select line is not limited. When a plurality of sense amplifiers are selected according to one column select line, provision of an independent source node for each one cross-coupled amplifier CC like in the present embodiment can also obtain a similar effect.

A circuit similar to the precharge circuit PC of the data line may be added to between the source nodes NS0, NS1, etc. and PS0, PS1, etc. of the NMOS and the PMOS respectively. In this case, as the source node can be precharged to the data line precharge level VDLR during the precharge period, a variation in the source node during the precharge period can be suppressed. Accordingly, a stable operation can be realized. Only a switch that short circuits between the NMOS source node and the PMOS source node can set these source nodes at the same level. Therefore, a stable operation can be realized.

Figure 3:
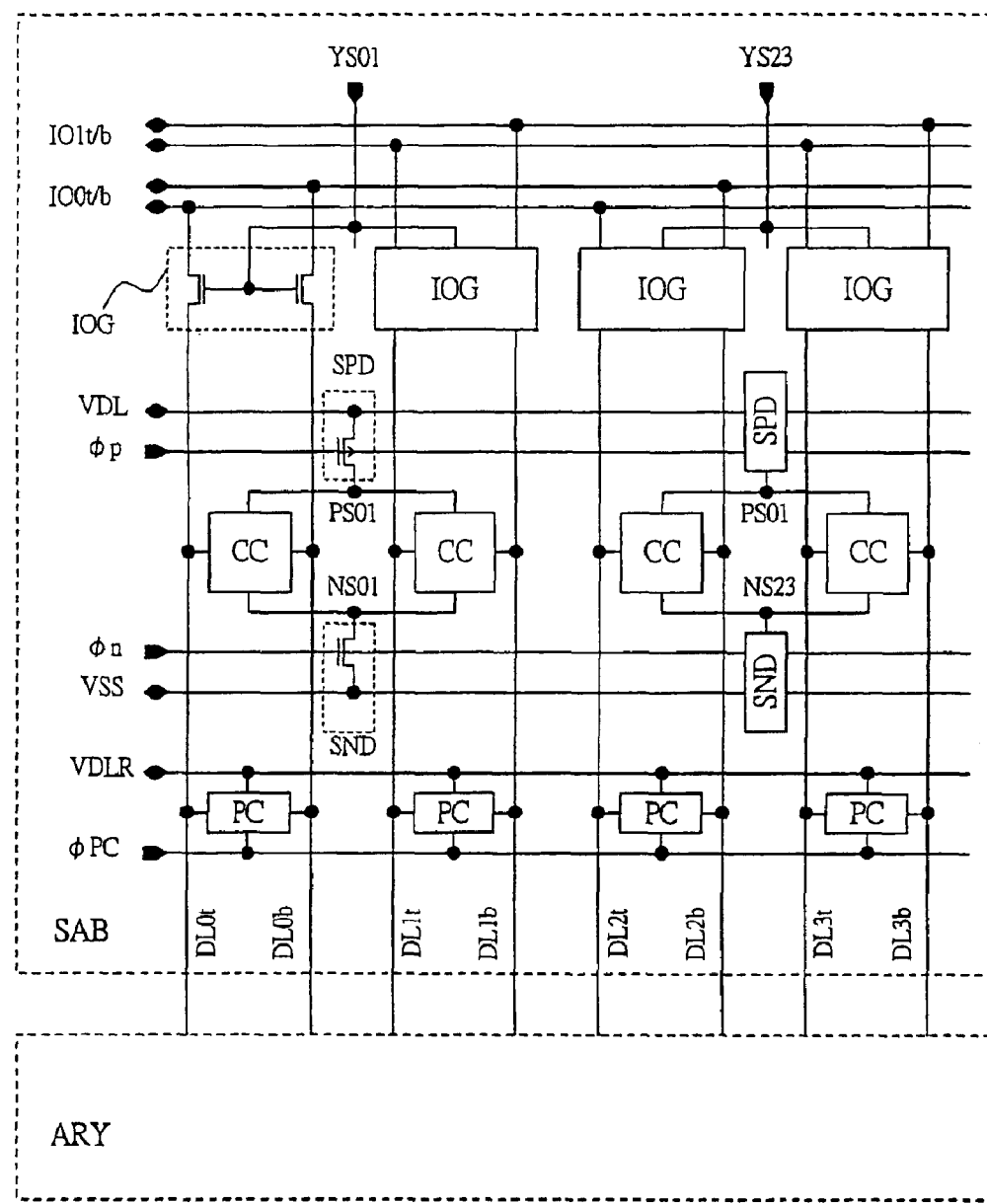
FIG. 3 is an illustration of a modification of the arrangement of the first embodiment.

FIG. 3 illustrates a modification of the arrangement in the first embodiment. In the present arrangement, two sense amplifiers are selected for one column select line. Data is written into both sense amplifiers at the same time from I/O lines IO0t/b and IO1t/b. In the present arrangement, two data line pairs DL2t/b and DL3t/b are selected for one column select line YS23. The source node of the cross-coupled amplifier CC connected with the two data line pairs is connected in common to an NMOS source node NS23 and a PMOS source node PS23. These source nodes are isolated from the source node NS01 and PS01 of the adjacent cross-coupled amplifier CC respectively.

Figure 14B:
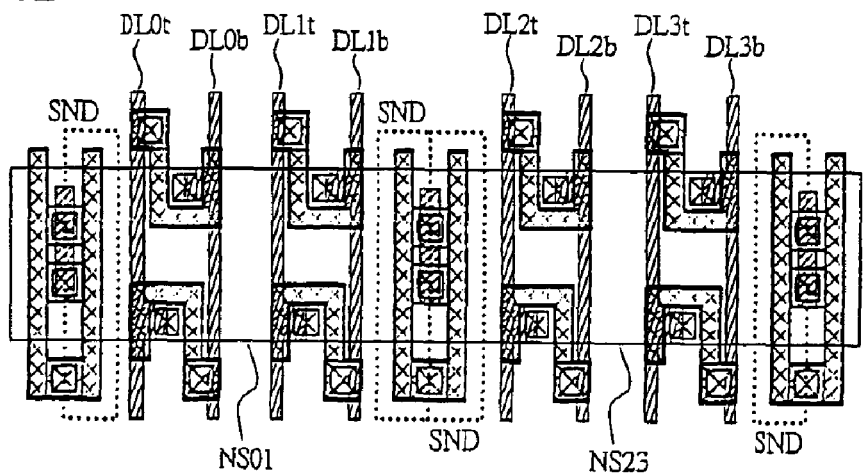
FIG. 14B is an illustration of a layout of a cross-coupled portion.

FIG. 14B is an illustration of a conduction type at one side of the cross-coupled amplifier CC and a layout of a sense amplifier driver section. When the total arrangement is based on NMOS, the NMOS source node of the cross-coupled amplifier CC and the drain of the sense amplifier driver SND are connected to each other with the diffusion layer. The source of the sense amplifier driver SND shares the diffusion layer with the source of the adjacent sense amplifier driver SND. Two adjacent cross couples share the source node, and are isolated from the cross couples at both sides thereof with the sense amplifier driver SND. The data line connected to the cross couples that share the source is selected by the common column select line. The data line and the gate drain are connected in a method similar to that according to the first embodiment.

The operation according to the present arrangement is similar to that according to the first embodiment except that data is written into two data line pairs at the same time using one column select line, and that the source node of the cross couple connected to the two data line pairs shifts in common.

Advantages of the present arrangement will be explained. In addition to the advantages of the first embodiment, there is an advantage that (3) as the number of column select lines becomes half of that according to the first embodiment, the wiring layout of the column select lines is facilitated.

Further, the present invention can be extensively applied to an arrangement in which a plurality of sense amplifiers are selected using one column select line. For example, when eight sense amplifiers are selected using one column select line, the source nodes of the eight sense amplifier cross couples CC that are selected simultaneously can be shared in common, or all independent, or independent for each two, or independent for each four. Similar effects can be obtained from these arrangements.

A precharge circuit or an equalizer can be added to between a pair of source nodes in a similar manner to that according to the first embodiment. Advantages similar to those according to the first embodiment can be obtained.

Figure 4:
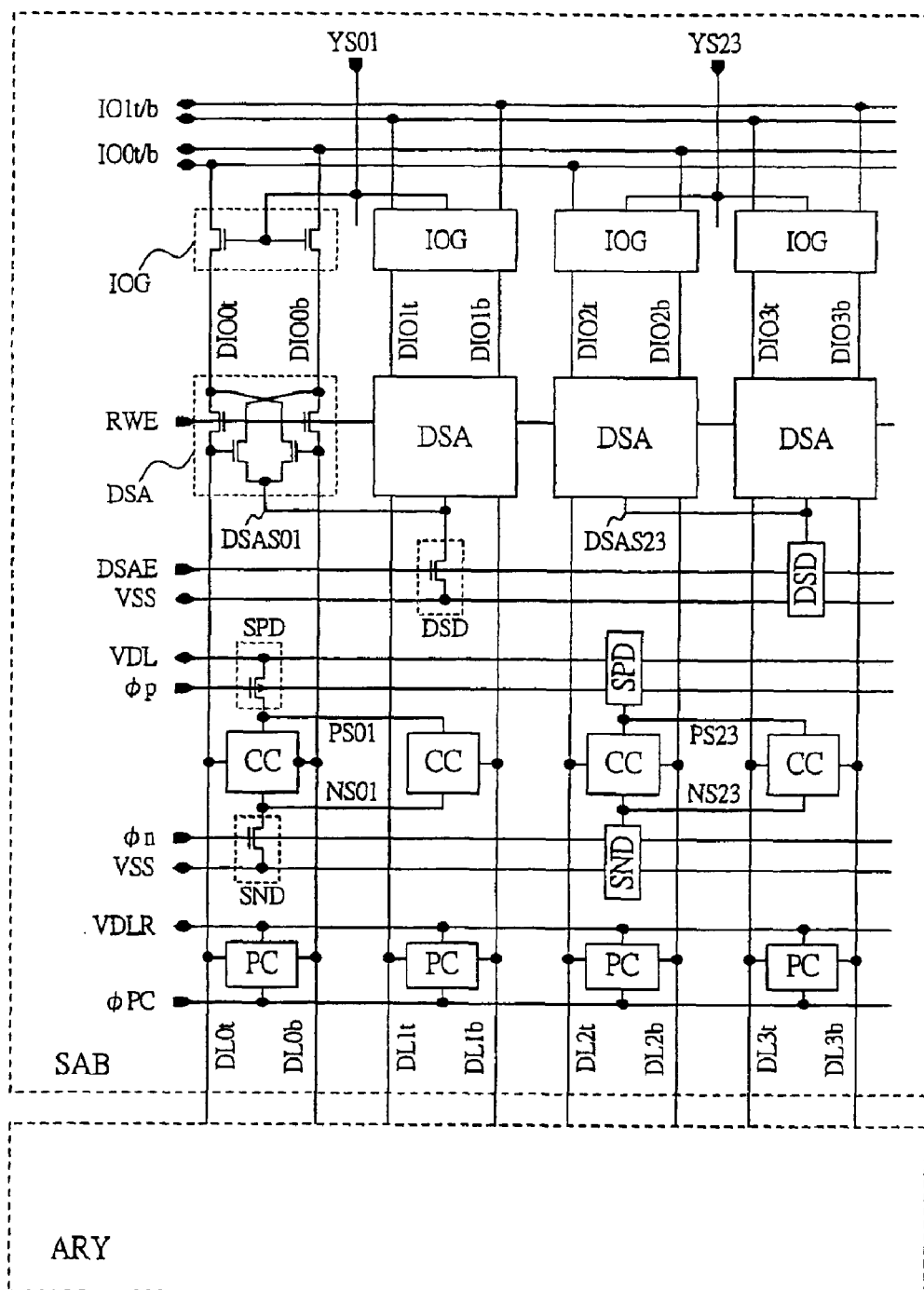
FIG. 4 is a configuration diagram of a sense amplifier block and a periphery thereof according to the second embodiment of the present invention.

The second embodiment of the present invention will be explained next with reference to FIG. 4. FIG. 4 illustrates a part of the sense amplifier block SAB. In the present arrangement, a direct sense amplifier that speeds up the read operation is applied to the I/O section in place of the sense amplifier circuit according to the first embodiment. In a similar manner to that of the first embodiment shown in FIG. 3, for example, the two data line pairs DL0t/b and DL1t/b are selected for one column select line YS01. The source node of the cross-coupled amplifier CC connected with the two data line pairs is connected in common to an NMOS source node NS01 and a PMOS source node PS01. The source nodes NS01 and PS01 are isolated from the source nodes NS23 and PS23 of the adjacent cross-coupled amplifier CC respectively. In the direct sense amplifier DSA that is added to the present arrangement, the data line is input to the gate, the source is connected in common to the common source node, and the drain becomes the I/O node. When the direct sense amplifier DSA is in the read operation, a direct sense driver DSD that is controlled by a direct sense amplifier enable signal DSAE drives the source node to the low voltage level VSS, thereby to output data to the I/O node. A switch that is controlled by an array write enable signal RWE is connected to the I/O node. In the write operation, data is written into the data line pair via the I/O gate IOG and this switch. As the gate receives the data line, in the read operation, the column select line can be enabled before a sufficient quantity of signal is read out to the data line pair. Therefore, this has an advantage in that the access time can be shortened. According to the present arrangement, the source node of the direct sense amplifier DSA that is selected by the common column select line YS01 is connected to a common direct sense source node DSAS01, and is isolated from an adjacent direct sense amplifier node DSAS23, like the source nodes NS01 and PS01 of the cross-coupled amplifier CC. Other circuit arrangements are similar to those of the first embodiment.

Figure 5:
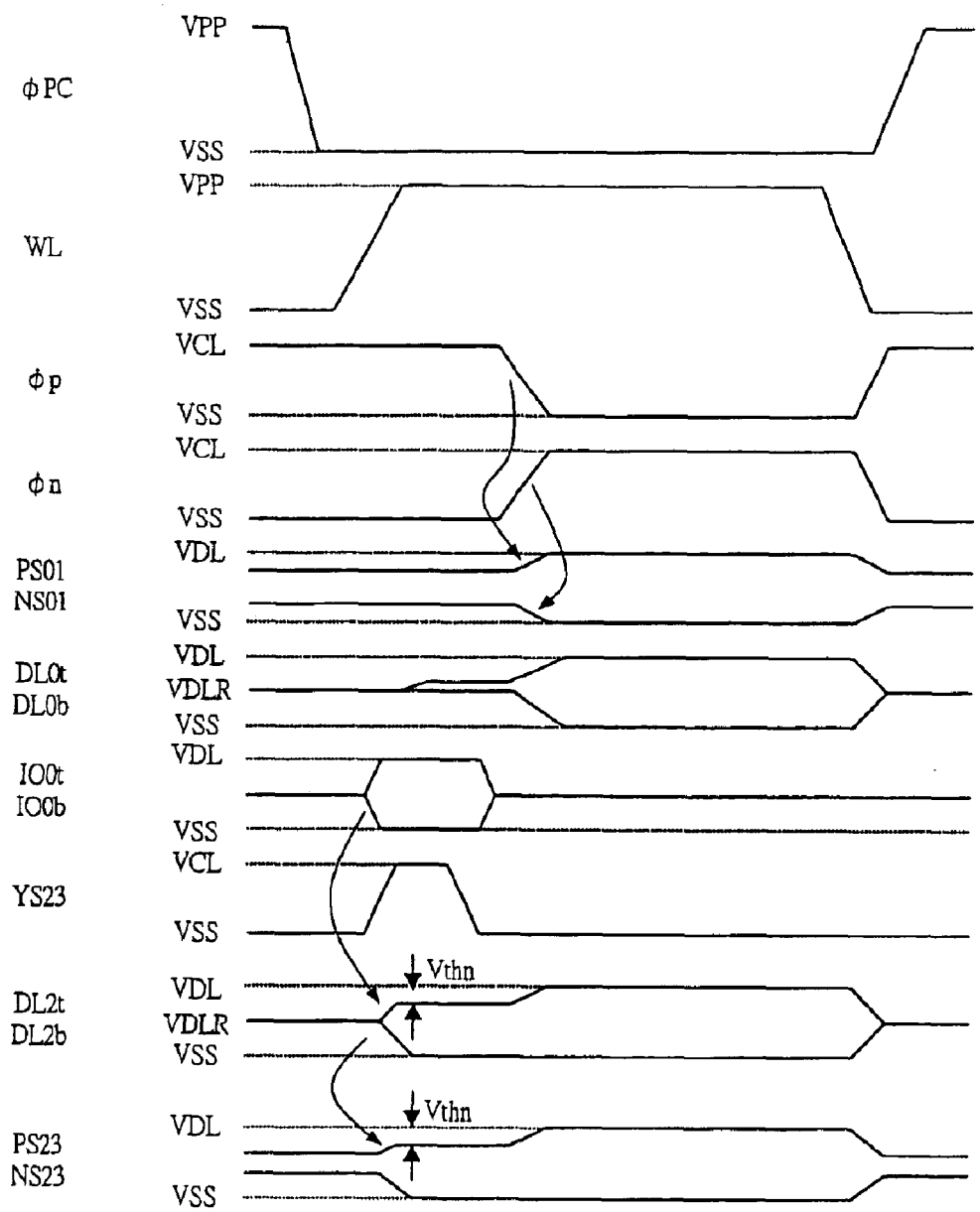
FIG. 5 is an operation waveform diagram according to the second embodiment.

The write operation of the present circuit arrangement will be explained with reference to FIG. 5. "H" data is written into a write-selected storage node SN2 in advance. An address is transferred to a memory array at the same time as the write command. Following the transferred address, a precharge signal φPC of a specific sense amplifier block shifts from a supply voltage VCL for peripheral circuit or a boosted voltage VPP for word line at a high voltage level to an unselected level VSS. Thereafter, a word line WL corresponding to the transferred address shifts to the boosted voltage VPP as the selected level. A column select line YS23 corresponding to the address transferred at the same time as the word line or before or after the word line shifts to the supply voltage VCL for peripheral circuit as the selected level. The array write enable signal RWE shifts to the low voltage level VSS before the word line selection during a period other than the writing period. During the writing, the selected voltage down level VCL is maintained. Accordingly, the data lines DL2t/b and DL3t/b are connected to the I/O lines IO0t/b and IO1t/b respectively. At this time, the write data is transferred to the data line pair by a write buffer that drives the I/O lines IO0t/b and IO1t/b. Data irrelevant to the data written in the storage nodes SN2 and SN3 are written into the data lines DL2t/b and DL3t/b respectively. The data are written in amplitude that is limited by the threshold voltage Vthn of the NMOS transistor of the I/O gate IOG. When the data line pair has the amplitude smaller than the array operation voltage VDL by the threshold voltage Vth, the voltage between the NMOS source node NS23 and the PMOS source node PS23 becomes the level smaller than the array operation voltage VDL by the threshold voltage Vth. In the present arrangement, the source node of the cross-coupled amplifier CC is isolated for each column select line. Therefore, the voltage between the source nodes (PS01–NS01) of the cross-coupled amplifier CC of the data lines DL0t/b and DL1t/b selected by the adjacent column select line YS01 holds the amplitude at the precharge time, which does not bring about a pre-sensing operation. In the direct sense amplifier DSA according to the present arrangement, when the array write enable signal RWE is at the high voltage level VCL, the data lines DL2t/b, DL3t/b, etc. are connected to the I/O output side data lines DIO2t/b, DIO3t/b, etc., thereby forming an NMOS cross coupled type arrangement. Therefore, when the source node of the direct sense amplifier DSA is driven, the data lines L2t/b, DL3t/b, etc. are amplified via the I/O output side data lines DIO2t/b, DIO3t/b, etc. In the present arrangement, the source node of the direct sense amplifier DSA is isolated for each column select line. Therefore, even when the source node DSAS23 of the write select direct sense amplifier is driven to the low voltage level VSS, the source node DSA01 of the direct sense DSA selected by the adjacent separate column select line YS01 is not driven. Accordingly, the direct sense amplifier DSA does not carry out the pre-sensing operation of the data line. Consequently, the write-unselected sense amplifier can carry out an accurate read operation. The precharge operation is similar to that of the first embodiment.

Advantages of the present arrangement will be explained. In addition to the advantages obtained from the modification of the first embodiment, the following advantages are obtained. (4) Read data can be output to the I/O line when the direct sense amplifier generates a fine signal in the data line pair. Therefore, the access time can be shortened. (5) The column select line can be enabled at the same time with the word line in the read operation. As it is not necessary to change the timing of the column select line between the write time and read time, the control circuit can be simplified. One column select line can be allocated to one direct sense amplifier, like in the first embodiment. In this case, the number of column lines increases. However, as the number of transistors connected to one column select line is halved, there is an advantage that the addition of the column select lines can be reduced.

Further, a precharge circuit or an equalizer can be added to between a pair of source nodes of the NMOS and PMOS in a similar manner to that according to the first embodiment. Advantages similar to those according to the first embodiment can be obtained.

Figure 6:
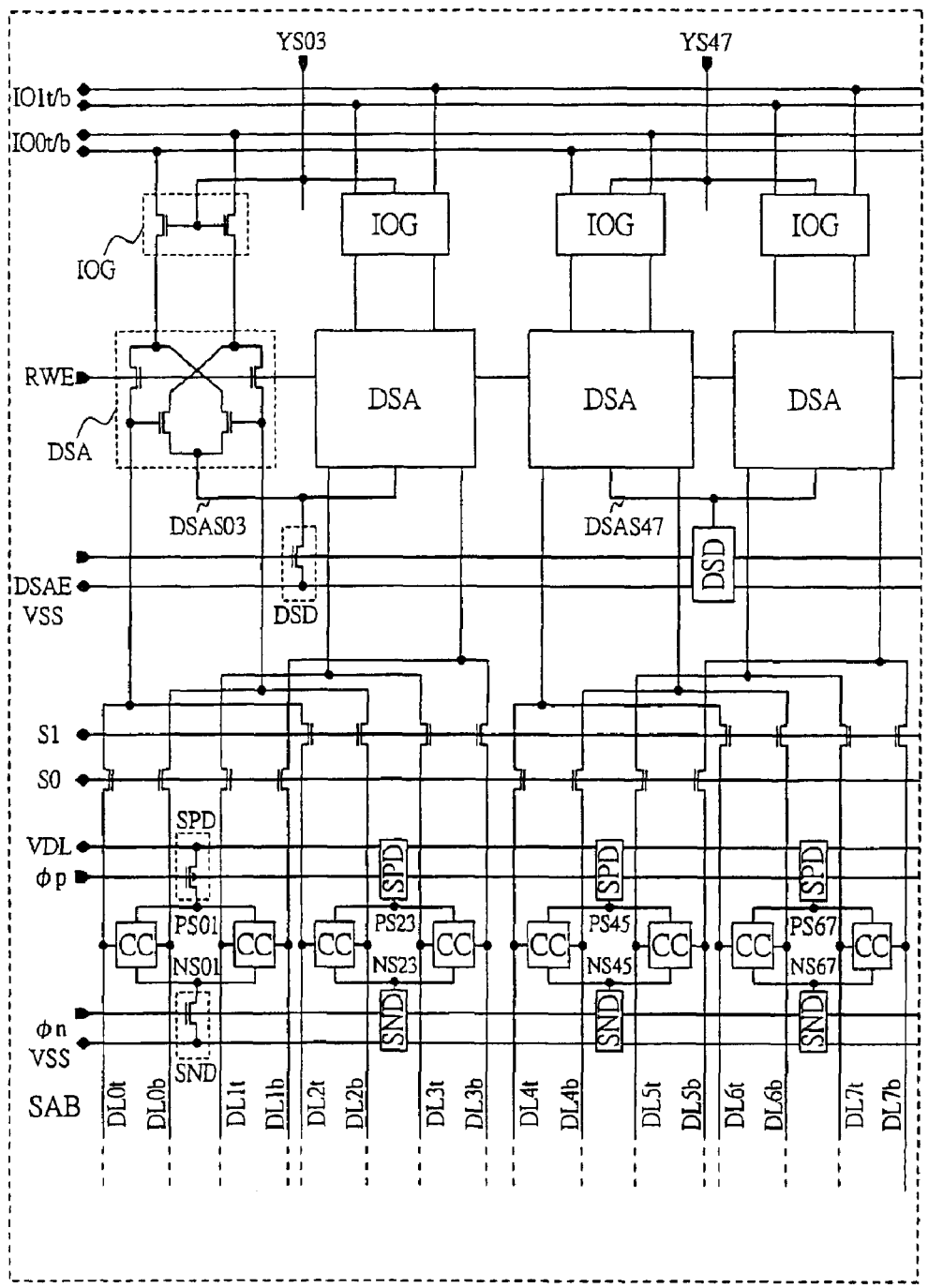
FIG. 6 is an illustration of a modification of the arrangement of the second embodiment.

FIG. 6 illustrates a modification of the arrangement in the second embodiment. FIG. 6 illustrates a part of the sense amplifier block SAB. In the present arrangement, two pairs of data lines share the direct sense amplifier DSA according to the second embodiment. Select lines S0 and S1 to select the direct sense amplifier DSA are added to the respective data line pairs. Other arrangements are similar to those according to the second embodiment.

The operation of a direct sense amplifier DSA selection switch is added to the operation according to the second embodiment. During the standby, the selection signals S0 and S1 are set to the high voltage level VCL. During the active operation, only the unselected side shifts to the low voltage level VSS. Other operations are similar to those in the second embodiment.

Advantages of the present arrangement are as follows. As the two pairs of data lines share the direct sense amplifier, the layout area of the sense amplifier block SAB can be reduced. On the other hand, the gate width of the direct sense amplifier can be increased in the same area, and the output signal to the I/O line can be made larger. Further, the number of column select lines can be one for four pairs of data lines, which facilitates the wiring, like in the first embodiment. It is also possible to allocate one column select line to one direct sense amplifier. In this case, the number of column select lines increases, but the number of transistors connected to one column select line is halved. Therefore, there is an advantage in that the addition of the column select line can be reduced.

A precharge circuit or an equalizer can be added to between a pair of source nodes in a similar manner to that according to the first embodiment. Advantages similar to those according to the first embodiment can be obtained.

Figure 7:
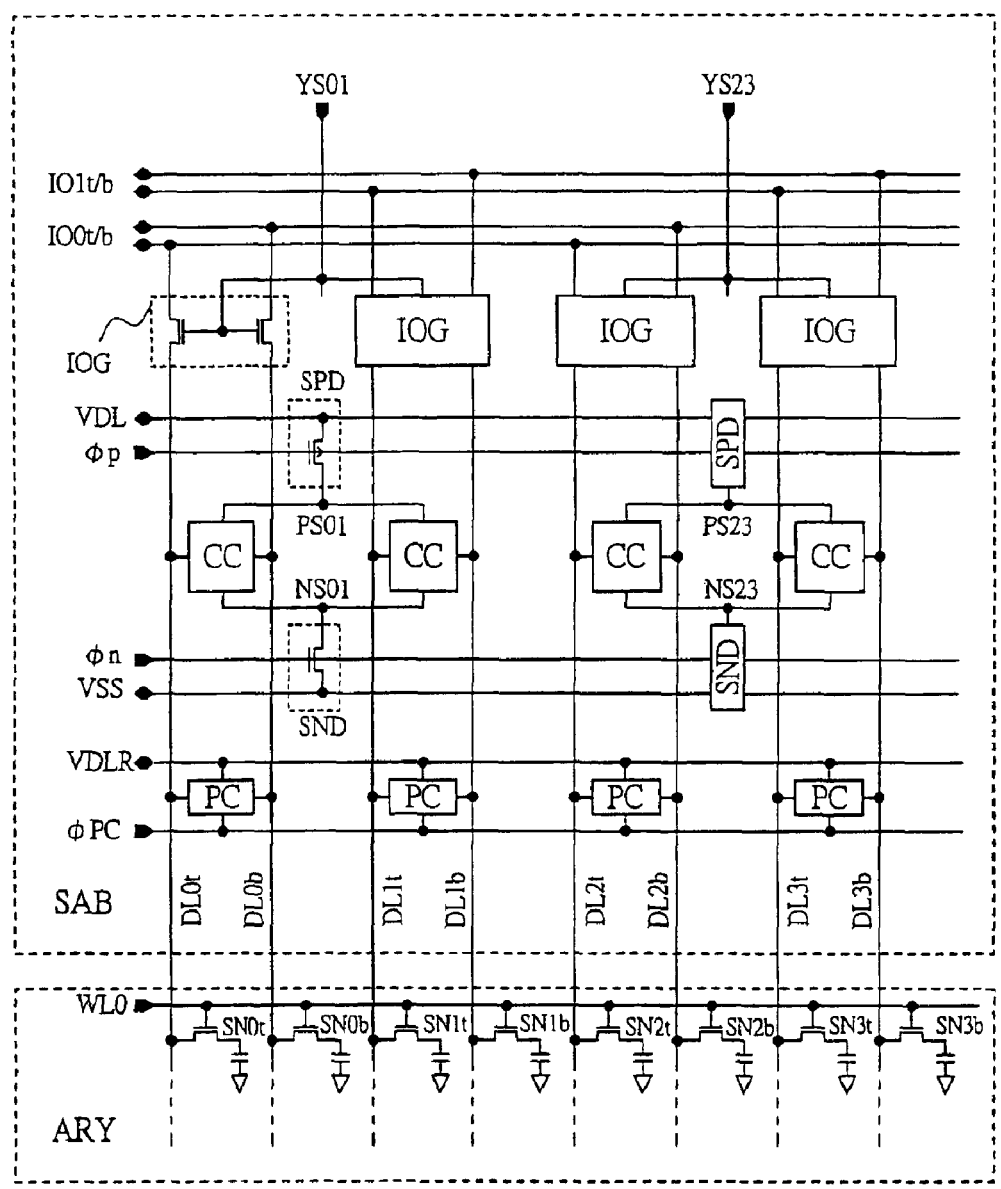
FIG. 7 is a configuration diagram of a sense amplifier block and a periphery thereof according to the third embodiment of the present invention.

The third embodiment of the present invention will be explained next with reference to FIG. 7. FIG. 7 illustrates a part of the sense amplifier block and the memory array. In the present arrangement, the present invention is applied to a twin cell array that stores one bit in two cells. The array portion of the present arrangement has the following features. When one word line WL0 is physically or logically selected, memory cells are connected to all the data lines of the data line pairs DL0t/b, DL1t/b, etc. Data are read to the respective data lines. The circuit arrangement of the sense amplifier block SAB is similar to that in the modification diagram 3 of the first embodiment.

Figure 8:
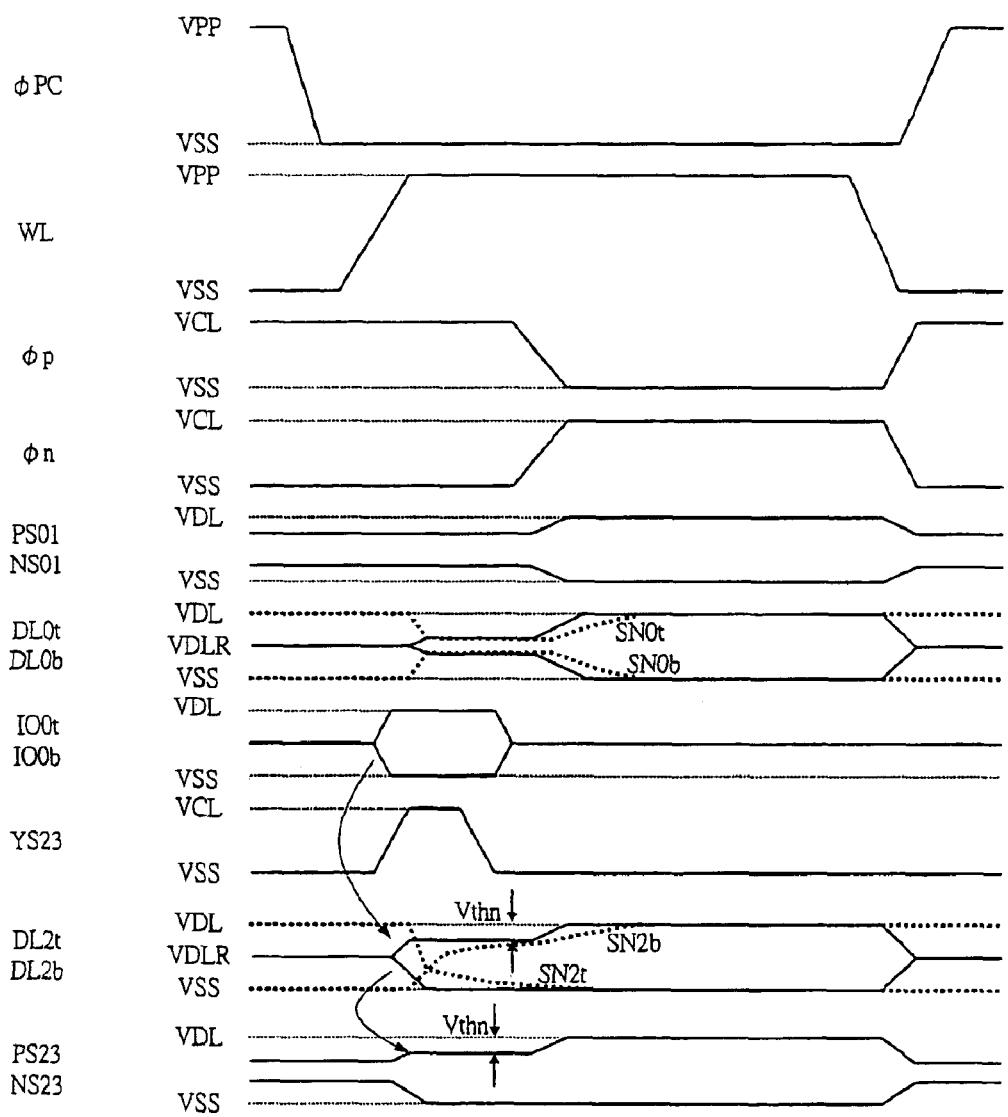
FIG. 8 is an operation waveform diagram according to the third embodiment.

The write operation of the present circuit arrangement will be explained with reference to FIG. 8. "H" and "L" data are written into a storage node SN2t/b respectively in advance. An address is transferred to a memory array at the same time as the write command. Following the transferred address, a precharge signal φPC of a specific sense amplifier block shifts from a supply voltage VCL for peripheral circuit or a boosted voltage VPP for word line at a high voltage level to an unselected level VSS. Thereafter, a word line WL0 at an address corresponding to the transferred address shifts to the boosted voltage VPP as the selected level. The column select line YS23 corresponding to the address transferred at the same time as the word line or before or after the word line shifts to the supply voltage VCL for peripheral circuit as the selected level. As a result, the data lines DL2t/b and DL3t/b are connected to the data I/O lines IO0t/b and IO1t/b. At this time, the write data transferred to the array is transferred to the sense amplifier by a write buffer that drives the I/O lines IO0t/b and IO1t/b. Data irrelevant to the data written in the storage nodes SN2t/b and SN3t/b are written into the data lines DL2t/b and DL3t/b respectively in the sense amplifier. On the other hand, the "H" or "L" cells are connected to the write-unselected data lines DL0t/b and DL1t/b respectively. The data line level shifts to a potential higher than the precharge level VDLR by a read-out signal voltage Vsig or to a low potential side. The data are written in a voltage amplitude that is limited by the threshold voltage Vthn of the NMOS transistor of the I/O gate IOG, from the I/O lines IO0t/b and IO1t/b into the data lines DL2t/b and DL3t/b respectively. When the data line pair has the amplitude smaller than the array operation voltage VDL by the threshold voltage Vth, the voltage between the NMOS source node NS01 and the PMOS source node PS23 becomes the level smaller than the array operation voltage VDL by the threshold voltage Vth. In the present arrangement, the source node of the cross-coupled amplifier CC is isolated for each column select line. Therefore, the voltage between the source nodes (PS01–NS01) of the cross-coupled amplifier CC of the data lines DL0t/b and DL1t/b selected by the adjacent column select line YS01 holds the amplitude at the precharge time, which does not bring about a pre-sensing operation. In the direct sense amplifier DSA according to the present arrangement, when the array write enable signal RWE is at the high voltage level VCL, the data lines DL2t/b, DL3t/b, etc. are connected to the I/O output side data lines DIO2t/b, DIO3t/b, etc. This forms an NMOS cross-coupled type arrangement. Therefore, when the source node of the direct sense amplifier DSA is driven, the data lines DL2t/b, DL3t/b, etc. are amplified via the I/O output side data lines DIO2t/b, DIO3t/b, etc. However, in the present arrangement, the source node of the direct sense amplifier DSA is isolated for each column select line. Therefore, even when the source node DSAS23 of the write select direct sense amplifier is driven to the low voltage level VSS, the source node DSA01 of the direct sense DSA selected by the adjacent separate column select line YS01 is not driven. Accordingly, the direct sense amplifier DSA does not carry out the pre-sensing operation of the data line. Consequently, the write-unselected sense amplifier can carry out an accurate read operation. When the initialization or write operation is carried out when the memory cell data is in the undefined state such as the power up time, the following problems occur according to the conventional system. The voltage between the source nodes of the write-selected cross-coupled amplifier becomes a value determined by resistance division of the sense drivers SND and SPD due to the through current of the adjacent cross couple. This voltage becomes lower than the power source voltage, and a sufficient write amplitude cannot be obtained. However, when the source node of the cross couple is isolated for each write-selected sense amplifier like in the present invention, no through-current flows in the selected cross-coupled sense amplifier. Therefore, the source node voltage of the selected sense amplifier rises to the vicinity of the power source voltage, and sufficient write voltage amplitude can be obtained.

Advantages of the present arrangement will be explained. (1) As data is written at the same time as the reading of data from the memory cell, a high-speed write operation becomes possible. (2) A pre-sensing operation can be prevented in the adjacent cross-coupled circuit at the write time, and a stable read operation can be realized. (3) The number of column select lines is halved from that according to the first embodiment, and therefore, the wiring layout of the layer of the column select lines becomes easy. (4) As the two-cell/bit array is used, the amplitude of the signal that is input to the cross-coupled amplifier CC becomes twice as large as that of the one-cell/bit at the same voltage. (5) As the complementary data of "H" and "L" data are read to the data line pair as the input of the cross-coupled amplifier CC, the operation point of the cross-coupled amplifier CC does not change due to the data pattern. Therefore, a variation in the operation speed due to the data pattern can be reduced. (6) The influence of the through current in the cross couple attributable to the undefined state of the memory cell in the two-cell/bit array is eliminated. It is possible to prevent the write voltage from being decreased due to a reduction in the voltage between the source nodes when the power is up. Therefore, secure initialization and write operation can be realized. One column select line can be allocated to one data line pair like in the first embodiment. In this case, the number of column select lines increases, but the number of transistors connected to one column select line is halved. Therefore, there is an advantage in that the addition of the column select lines can be reduced.

Further, a precharge circuit or an equalizer can be added to between a pair of source nodes of the NMOS and PMOS in a similar manner to that according to the first embodiment. Advantages similar to those according to the first embodiment can be obtained.

A modification of the arrangement according to the third embodiment will be explained next with reference to FIG. 9.

Figure 9:
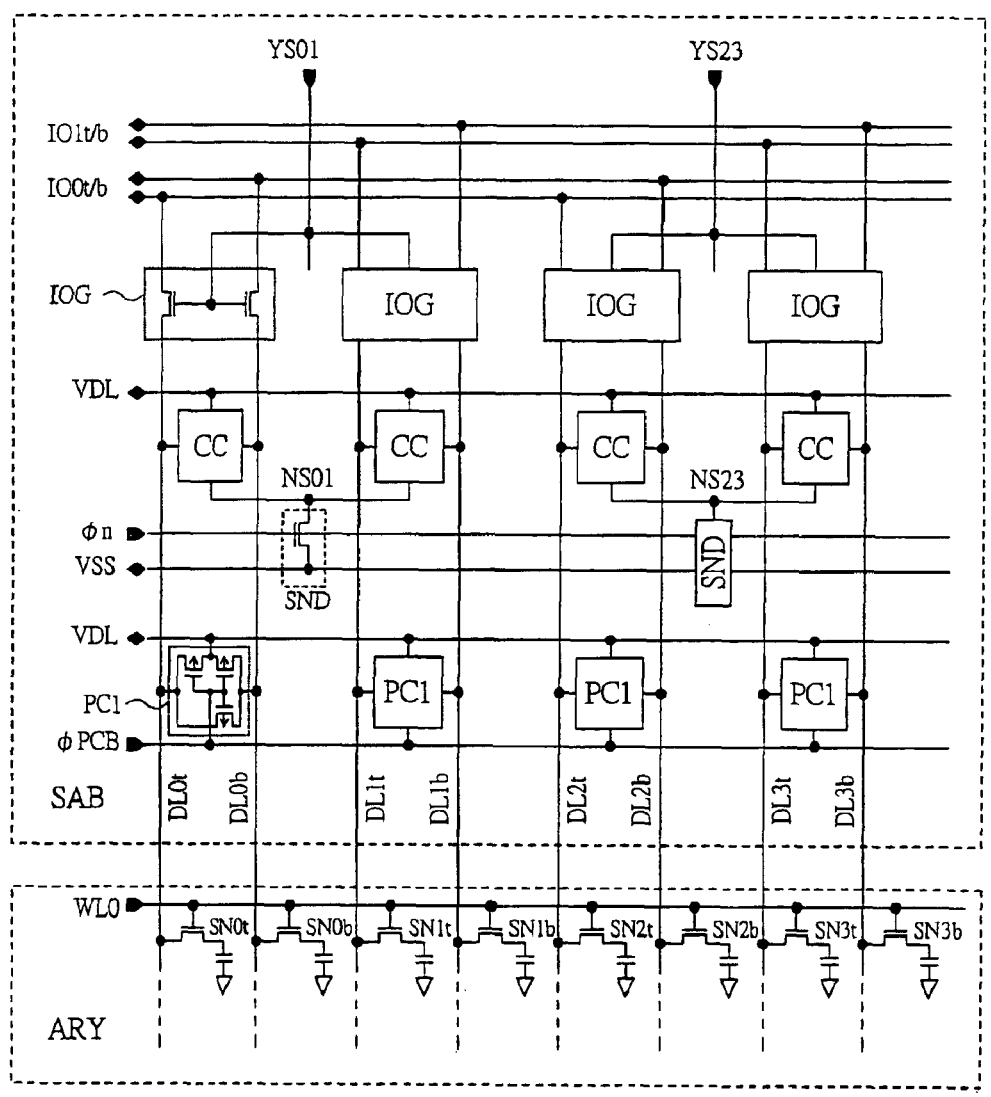
FIG. 9 is an illustration of a modification of the arrangement of the third embodiment.

FIG. 9 illustrates a state that the data line precharge level of the two-cell/bit array is set to the data line high voltage level VDL. In the present arrangement, the NMOS source node of the cross couple CC is independent for each column select line in a similar manner to that of the above embodiment. The NMOS sense amplifier driver SND is connected to each source node. The sense amplifier driver SND drives the source node at the low voltage level VSS by the sense amplifier enable signal φn. On the other hand, the PMOS source nodes of the cross couple are connected all in common to the data line high voltage level VDL. A precharge circuit PC1 precharges the data line pair to the data line high voltage level VDL by the precharge signal φPCB, and comprises three PMOSs. The I/O gate IOG is controlled by the column select line, and connects the data line pair with the I/O line.

Figure 10:
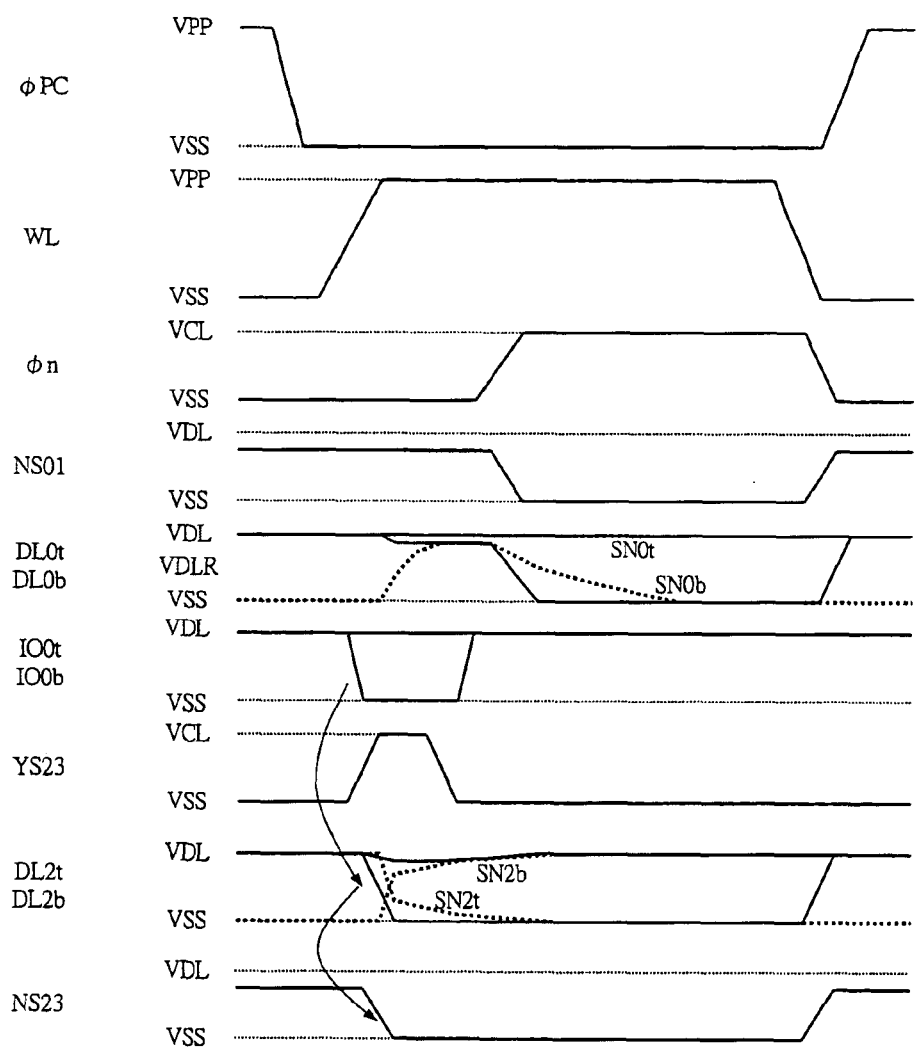
FIG. 10 is an operation waveform diagram according to the third embodiment.

The write operation in the present arrangement will be explained with reference to FIG. 10. The operation is similar to that according to the above embodiment, except that the logic of the precharge signal is inverted from the command input until when the word line WL and the column select line YS23 are selected. Until when the sense amplifier enable signal φ is input, the data line pairs DL2t/b and DL3t/b of which column select line is at the selected level are connected to the I/O lines IO0t/b and IO1t/b respectively. The I/O lines IO0t/b and IO1t/b are driven by the write buffer according to the write data. The write data is transferred to the data line pair via the I/O gate IOG. At this time, the data is written into the data line pair at a voltage (VDL−Vthn) that is lower than the high voltage level VDL, by the threshold voltage Vthn of the NMOS transistor of the I/O gate IOG. Consequently, the NMOS source node of the cross couple connected with the data line pair DL2t/b and DL3t/b is driven to the low voltage level VSS. In the present arrangement, as the NMOS source node of the cross-coupled amplifier CC is isolated by the column select line unit, the source node of the cross-coupled amplifier CC of the adjacent data line pair DL2t/b and DL3t/b is maintained at the potential of the precharge period. Therefore, pre-sensing operation is not carried out. Further, even when the PMOS source node is connected to the data line high voltage level VDL that is equivalent to the data line precharge level, the "H" level of write-selected data line does not shift to a potential higher than the data line high voltage level DVL. Therefore, this does not bring about a pre-sensing operation. Therefore, after the read signal is sufficiently read out from the cell, the sense amplifier enable signal φn shifts from the low voltage level VSS to the enable level VCL. The cross-coupled amplifier CC amplifies the fine signal of the data line pair to the data ling amplitude voltage VDL. Consequently, the write data or read data is written into the storage nodes SN0t/b, SN1t/b, etc. of the cells connected to the write selected data line pair DL2t/b and DL3t/b and the write-unselected data line pair DL0t/b and DL1t/b. When the data is written, the word line WL shifts to the unselected level VSS. Thereafter, the precharge signal φPCB shifts to the low voltage level VSS, thereby to precharge the data line pair. As a result, both high-speed write operation and stable read operation can be achieved.

Advantages of the present arrangement will be explained. In addition to the advantages obtained from the third embodiment, there are the following advantages. (7) As the two-cell/bit array is used, the reference level that is necessary in the one-cell/bit array is not required even when the data line high voltage level VDL precharge is carried out. (8) Based on the data line high voltage level VDL precharge, the amplification speed of the cross-coupled amplifier CC improves, the re-write time can be shortened, and the recycle time can be shortened.

Further, a precharge circuit or an equalizer can be added to between a pair of source nodes of the NMOS and PMOS of the cross couple in a similar manner to that according to the first embodiment. Advantages similar to those according to the first embodiment can be obtained.

Figure 11:
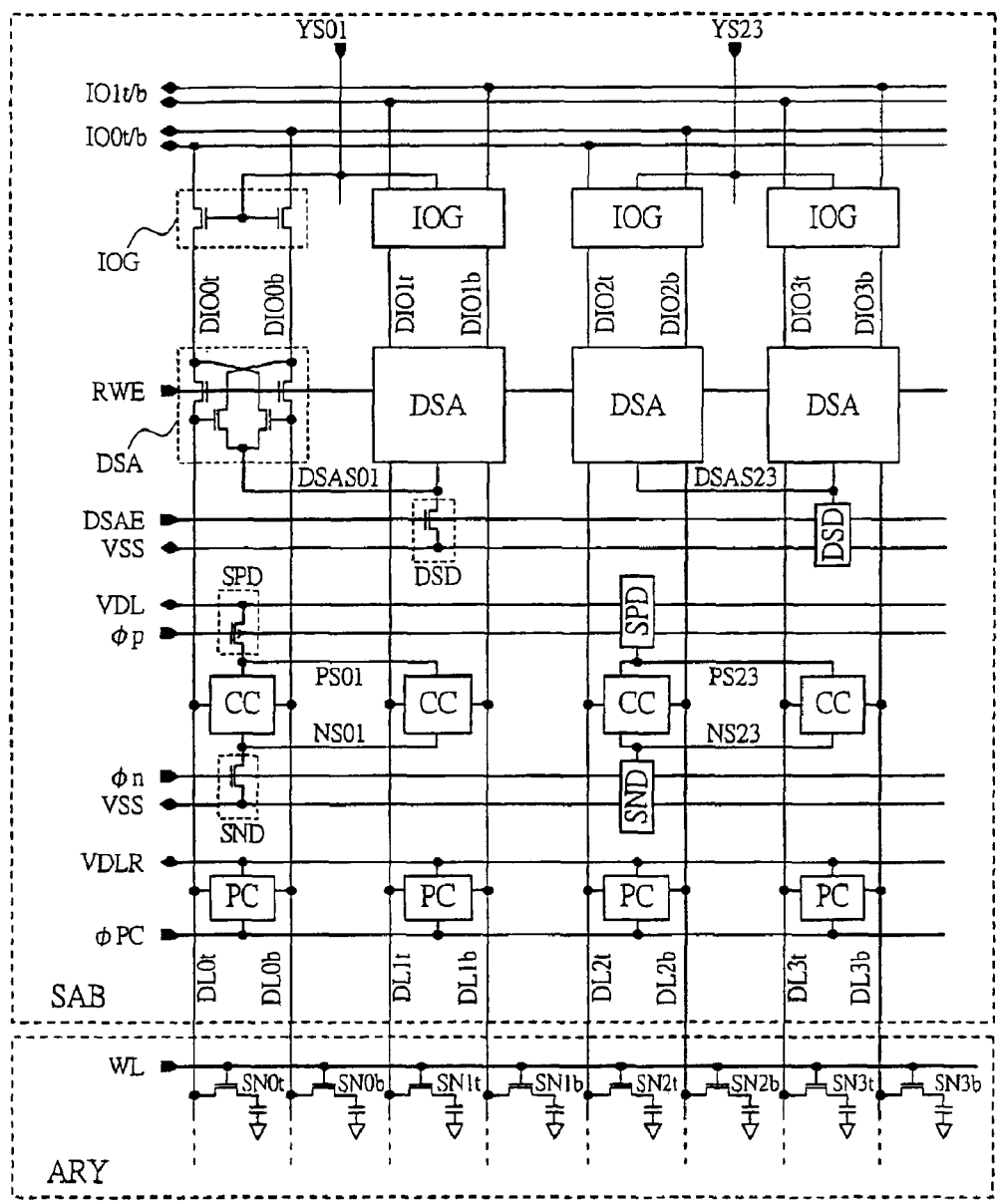
FIG. 11 is a configuration diagram of a sense amplifier block and a periphery thereof according to the fourth embodiment of the present invention.

The fourth embodiment of the present invention will be explained next with reference to FIG. 11. FIG. 11 illustrates a part of the sense amplifier block and the memory array. In the present arrangement, the sense amplifier block according to the second embodiment of the present invention is applied to the two-cell/bit array. The array portion of the present arrangement has the following features. When one word line WL0 is physically or logically selected, memory cells are connected to all the data lines of the data line pairs DL0t/b, DL1t/b, etc. Data are read to the respective data lines. For the sense amplifier block SAB, a direct sense amplifier is advantageously used that can output data to the I/O line when a fine signal is read out to the data line.

Figure 12:
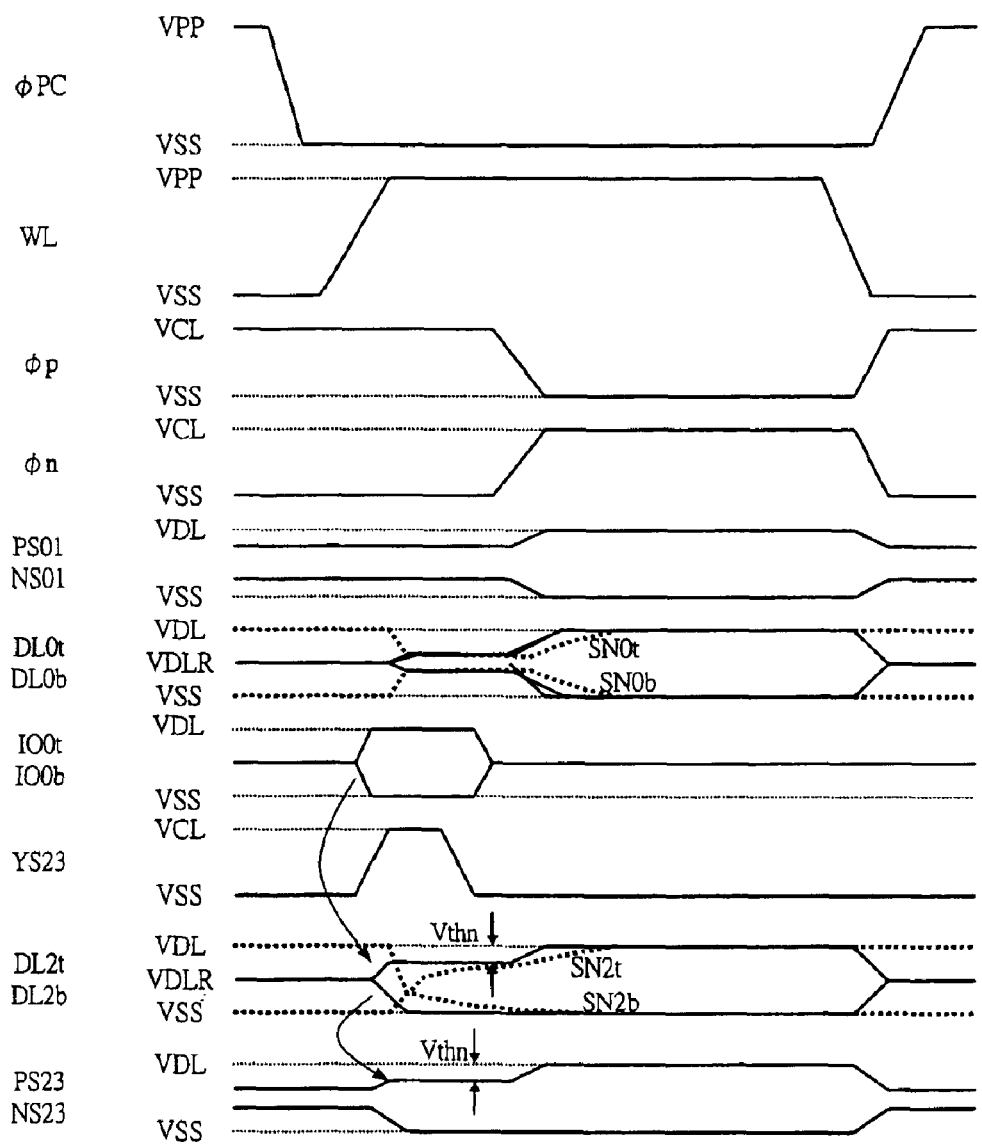
FIG. 12 is an operation waveform diagram according to the fourth embodiment.

The write operation of the present circuit arrangement will be explained with reference to FIG. 12. "H" and "L" data are written into the storage node SN2t/b respectively in advance. An address is transferred to a memory array at the same time as the write command. Following the transferred address, a precharge signal φPC of a specific sense amplifier block shifts from a supply voltage VCL for peripheral circuit or a boosted voltage VPP for word line at a high voltage level to an unselected level VSS. Thereafter, a word line WL0 at an address corresponding to the transferred address shifts to the boosted voltage VPP as the selected level. The column select line YS23 corresponding to the address transferred at the same time as the word line or before or after the word line shifts to the supply voltage VCL for peripheral circuit as the selected level. As a result, the data lines DL2t/b and DL3t/b are connected to the data I/O lines IO0t/b and IO1t/b. At this time, the write data is transferred to the sense amplifier by a write buffer that drives the I/O lines IO0t/b and IO1t/b. Data irrelevant to the data written in the storage nodes SN2t/b and SN3t/b are written into the data lines DL2t/b and DL3t/b respectively in the sense amplifier. On the other hand, the "H" or "L" cells are connected to the write-unselected data lines DL0t/b and DL1t/b respectively. The data line level shifts to a potential higher than the precharge level VDLR by a read-out signal voltage Vsig or to a low potential side. The data are written in a voltage amplitude that is limited by the threshold voltage Vthn of the NMOS transistor of the I/O gate IOG, from the I/O lines IO0t/b and IO1t/b into the data lines DL2t/b and DL3t/b respectively. When the data line pair has the amplitude smaller than the data line high voltage level VDL by the threshold voltage Vth, the voltage between the NMOS source node NS23 and the PMOS source node PS01 becomes smaller than the data line high voltage level VDL by the threshold voltage Vth. In the present arrangement, the source node of the cross-coupled amplifier CC is isolated for each column select line. Therefore, the voltage between the source nodes (PS01−NS01) of the cross-coupled amplifier CC of the data lines DL0t/b and DL1t/b selected by the adjacent column select line YS01 holds the amplitude at the precharge time, which does not bring about a pre-sensing operation. In the direct sense amplifier DSA according to the present arrangement, when the array write enable signal RWE is at the high voltage level VCL, the data lines DL2t/b, DL3t/b, etc. are connected to the I/O output side data lines DIO2t/b, DIO3t/b, etc. This forms an NMOS cross-coupled arrangement. Therefore, when the source node of the direct sense amplifier DSA is driven, the data lines DL2t/b, DL3t/b, etc. are amplified via the I/O output side data lines DIO2t/b, DIO3t/b, etc. However, in the present arrangement, the source node of the direct sense amplifier DSA is isolated for each column select line. Therefore, even when the source node DSAS23 of the write select direct sense amplifier is driven to the low voltage level VSS, the source node DSA01 of the direct sense DSA selected by the adjacent separate column select line YS01 is not driven. Accordingly, the direct sense amplifier DSA does not carry out the pre-sensing operation of the data line. Consequently, the write-unselected sense amplifier can carry out an accurate read operation.

Advantages of the present arrangement will be explained. (1) As data is written at the same time as the reading of data from the memory cell, a high-speed write operation becomes possible. (2) A pre-sensing operation can be prevented in the adjacent cross-coupled circuit at the write time, and a stable read operation can be realized. (3) The number of column select lines is halved from that according to the first embodiment, and therefore, the wiring layout of the layer of the column select lines becomes easy. (4) As the two-cell/bit array is used, the amplitude of the signal that is input to the cross-coupled amplifier CC becomes two times larger than that of the one-cell/bit. (5) As the complementary data of "H" and "L" is read to the data line pair as the input of the cross-coupled amplifier CC, the operation point of the cross-coupled amplifier CC does not change due to the data pattern. Therefore, a variation in the operation speed due to the data pattern can be reduced. (6) As the direct sense amplifier is used, the read data can be output at a high speed. (7) The column select line of read and write can be enabled at the same timing as the word line. Therefore, the control circuit can be simplified. (8) The influence of the through current in the cross couple attributable to the undefined state of the memory cell in the two-cell/bit array is eliminated. It is possible to prevent the write voltage from being decreased due to a reduction in the voltage between source nodes when the power is up. Therefore, secure initialization and write operation can be realized. One column select line can be allocated to one data line pair like in the first embodiment. In this case, the number of column select lines increases, but the number of transistors that are connected to one column select line is halved. Therefore, there is an advantage in that the addition of the column select lines can be reduced.

Further, a circuit similar to the precharge circuit PC of the data line can be added to between the data lines of the source nodes NS01, NS23, etc. of the NMOS and PS01, PS2, etc. of PMOS respectively. In this case, as the source node can be precharged to the data line precharge level VDLR during the precharge period, a variation in the source node during the precharge period can be suppressed. Accordingly, a stable operation can be realized. Only a switch that short circuits between the NMOS source node and the PMOS source node can set these source nodes at the same level. Therefore, a stable operation can be realized.

A total semiconductor device to which the present invention is applied will be explained next.

Figure 15:
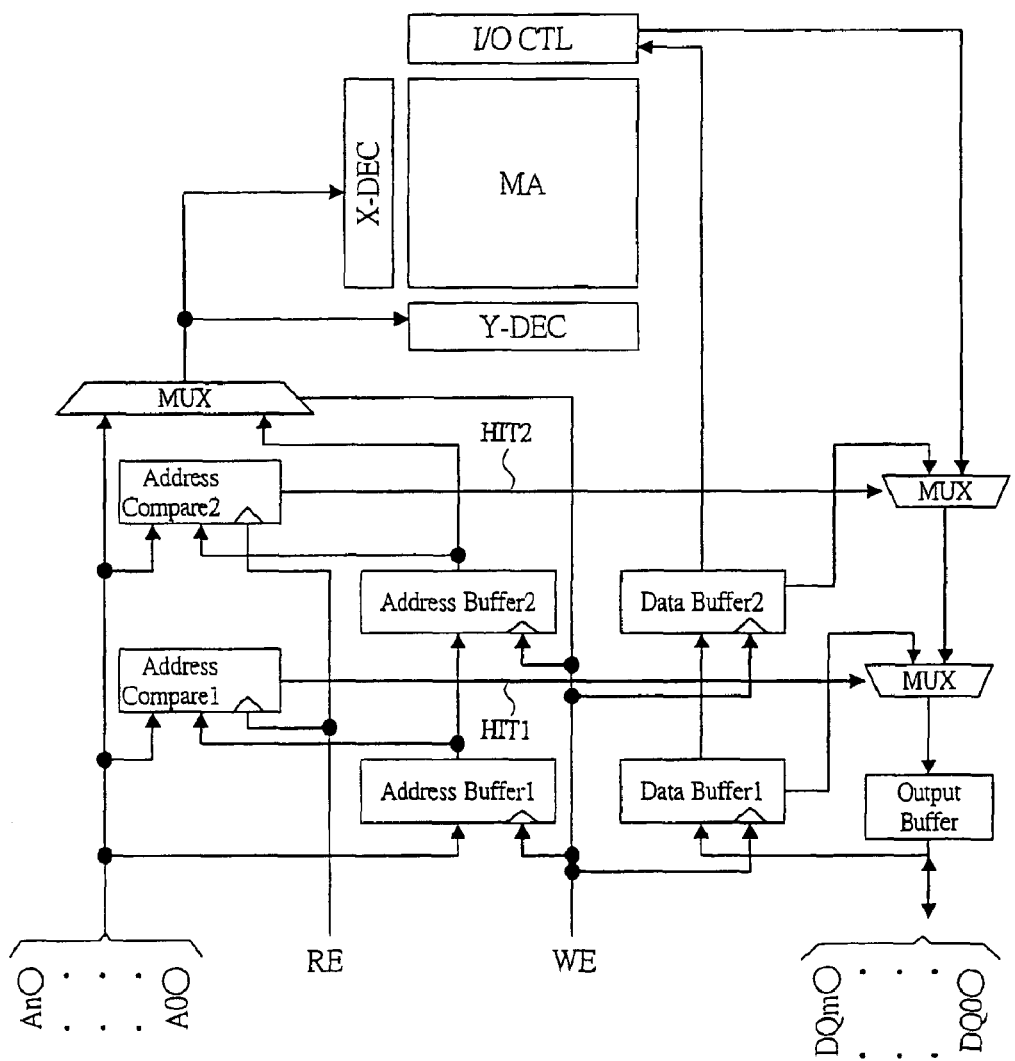
FIG. 15 is a block diagram of a DRAM to which the present invention is applied.
Figure 19:
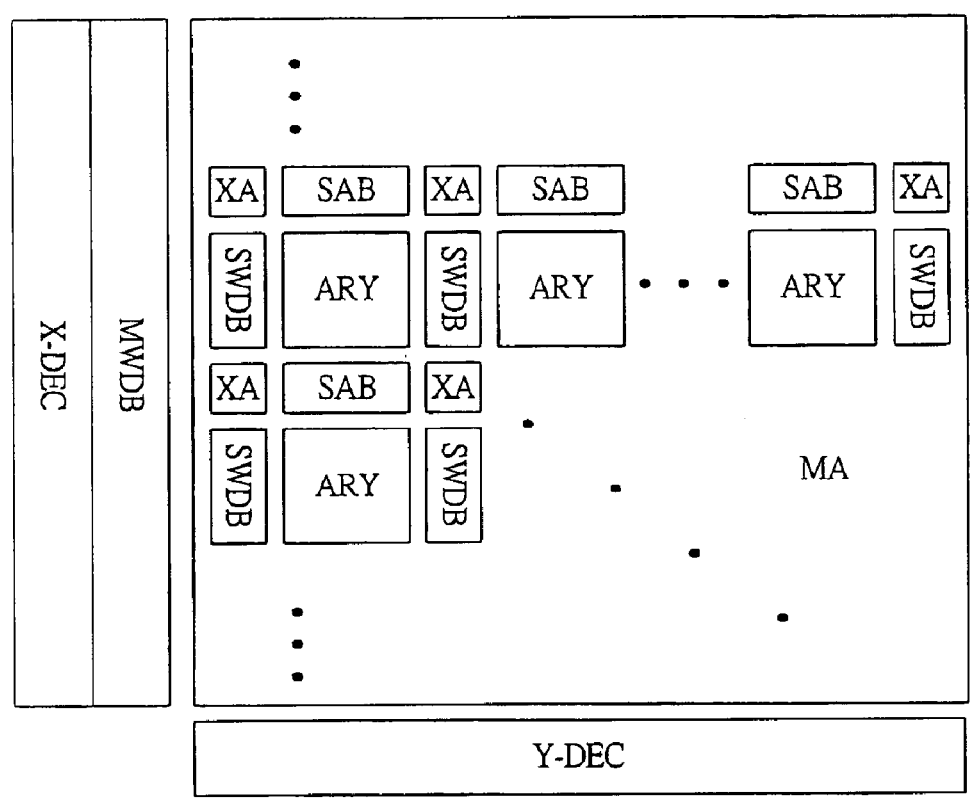
FIG. 19 is a bock diagram of a part of the memory array.
Figure 20:
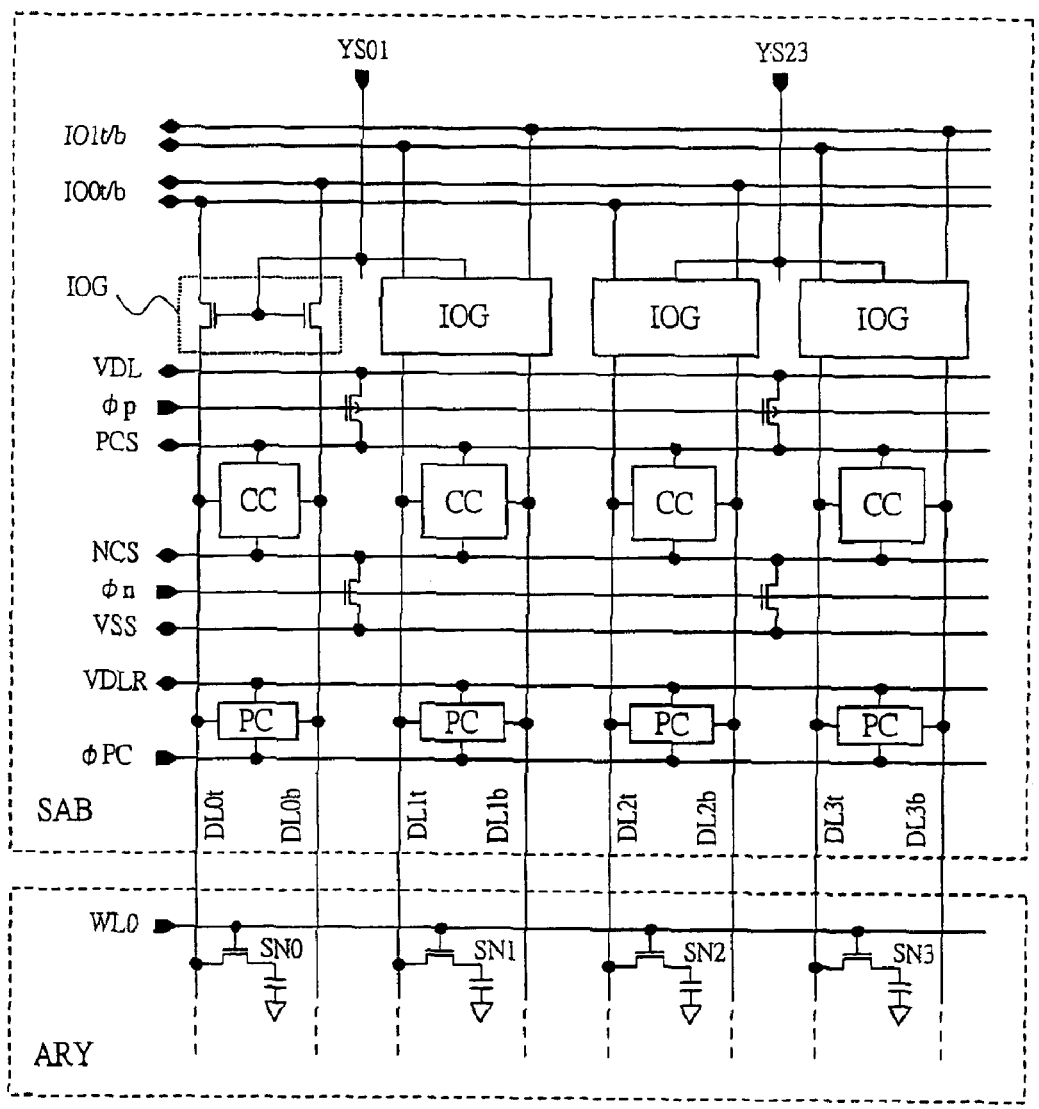
FIG. 20 is a configuration diagram of a conventional sense amplifier block and a periphery thereof.
Figure 21:
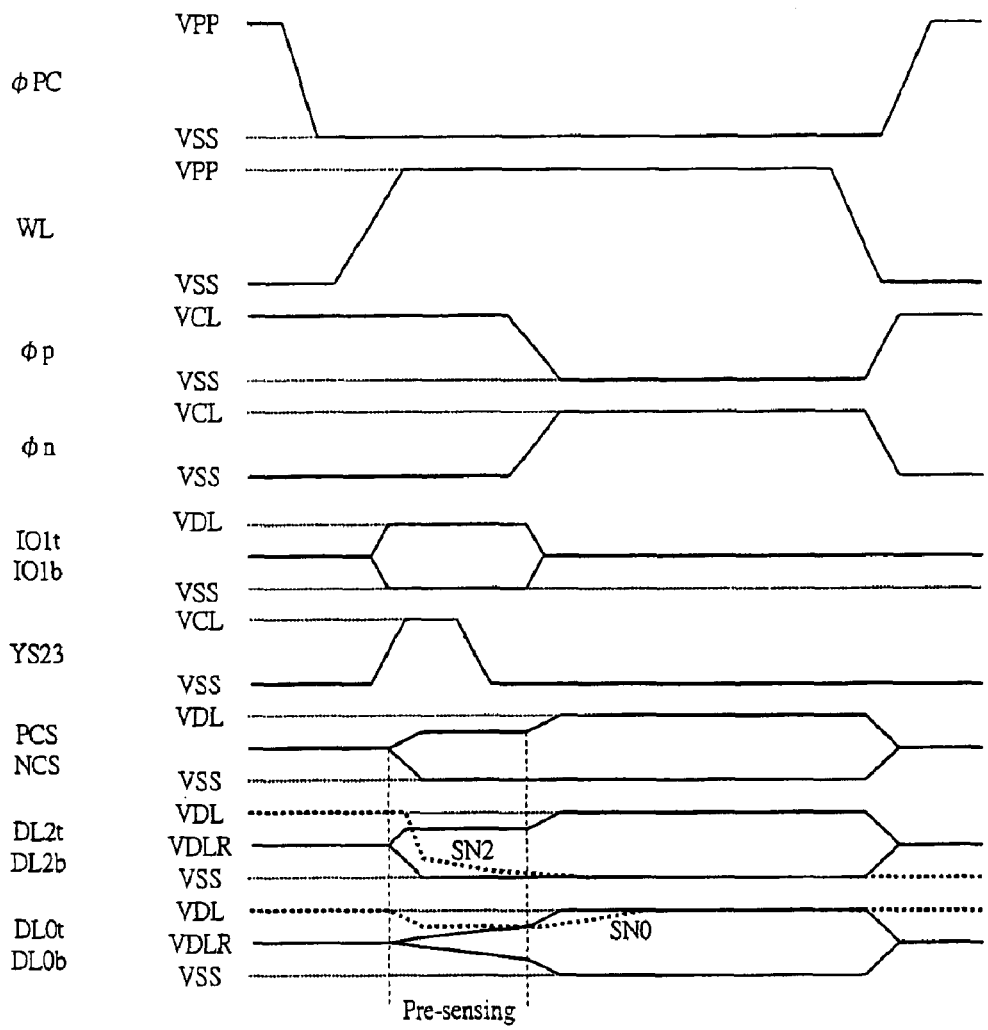
FIG. 21 is a waveform diagram when write before sense operation is carried out according to the conventional system.

FIG. 15 is a block diagram of a semiconductor device to which the present invention is preferably applied. The present arrangement is suitable when the array has a short cycle time. Addresses and data of the past two write cycles are held in address buffers and data buffers respectively. A data buffer 1 is a data holding circuit that temporarily stores write data of the last write cycle. A data buffer 2 is a data holding circuit that temporarily stores write data of the second last write cycle. Address buffers 1 and 2 store addresses corresponding to the data of the data buffers 1 and 2 respectively. An address comparator (Address Compare) is a circuit that compares addresses A0, . . . , and An which are input during the read or write time with the addresses which are held in the address buffers 1 and 2. A multiplexer (MUX) is a switch that selects a signal according to a control signal. An X decoder X-DEC and a Y decoder Y-DEC decode an address that is selected by the multiplexer. A data input/output section I/OCTL is a circuit block that controls the I/O data. An output buffer is a circuit block that controls a data output to the outside. A voltage generator VG is a circuit block that generates a power supply to circuits from an external voltage VCC. A timing clock generator TCG is a circuit block that determines a timing of the circuit operation. FIG. 19 illustrates in detail the arrangement of the X decoder X-DEC, the Y decoder Y-DEC, and a memory array MA. The memory array MA comprises a plurality of sub-word driver blocks SWDB, a plurality of sense amplifier blocks SAB, a plurality of sub-memory arrays ARY encircled by these blocks, and an intersection area XA. A main word driver block MWDB is a circuit block that outputs a main word line in a hierarchical word line structure.

In all the embodiments according to the present invention, an unshared SA scheme is explained in which one memory array is connected to one sense amplifier block. The present invention can also be applied to a shared SA scheme in which memory arrays at both sides of a sense amplifier block share the sense amplifier block, as is used in a general DRAM or the like. In this case, one sense amplifier block can be prepared for the adjacent arrays, which has an area reduction effect. Further, the present invention can also be applied to an alternative SA arrangement. In other words, sense amplifier blocks are disposed at both sides of one sub-array, and a data line pair within the memory array is connected to a sense amplifier of one of the sense amplifier blocks at both sides. In this case, the layout pitch of the sense amplifiers can be set to two times the layout pitch of data line pairs. This has an advantage in that the layout within the sense amplifier block becomes easy. Further, the present invention can also be applied to the array of the shared sense amplifier and the array of the alternative SA arrangement. This has an advantage in that the chip area can be reduced, and that the layout can be made simple.

Figure 16:
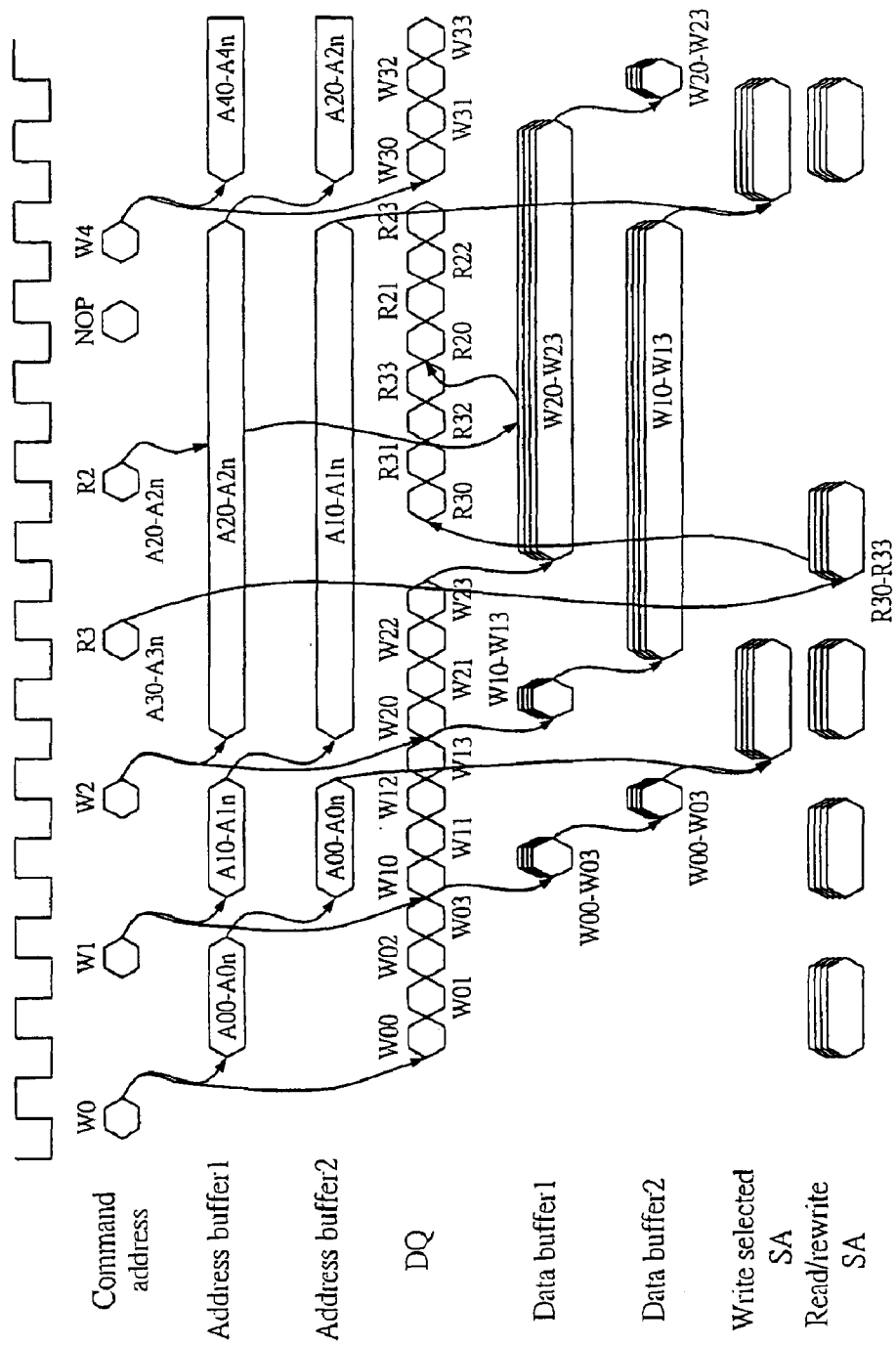
FIG. 16 is an illustration of the operation of the DRAM shown in FIG. 15.

The operation of the present semiconductor device will be explained with reference to FIG. 15 and FIG. 16. FIG. 16 is a timing chart of the operation. In the present arrangement, it is assumed that a four-bit pre-fetch operation is carried out for inputting and outputting four data per one I/O pin in one reading or write cycle. Further, the four bits are output as a burst length 4. In the pre-fetch operation, four-bit parallel data that are read out simultaneously are converted into serial data following the address, and the serial data is output to the outside. In the write operation, conversely, four-bit serial data is converted into parallel data, and the parallel data is transferred to the array. In the present arrangement, it is assumed that the write or read cycle time is two clock cycles, and a delay time from the input of the read command till the output of the read data is 1.5 clock cycles. However, the cycle times are not limited to these. The write operation will be explained first. It is assumed that the data buffers and the address buffers are initialized in advance. When the write command is input, corresponding addresses A00 to A0n are input at the same time. In a late write operation, write data W00 to W03 are input at a timing of one clock delayed from the input command. The write data W00 to W03 and the corresponding addresses A00 to A0n are held in the data buffer 1 and the address buffer 1 respectively until when the next write command is input. As shown in FIG. 16, when a write command WA1 is input in the following cycle, the write data W00 to W03 and the corresponding addresses A00 to A0n held in the data buffer 1 and the address buffer 1 are transferred to the data buffer 2 and the address buffer 2 respectively. These data and addresses are held in these buffers until when the next write command is input. Following this operation, write data W10 to W13 that are input in the present cycle are held in the data buffer 1, and corresponding addresses A10 to A1n are sent to the address buffer 2, and are held until when the next write command is input. When a write command WA2 is further input, the addresses A00 to A0n that are held in the address buffer 2 are sent from the multiplexer MUX to the X decoder and the Y decoder, and a specific address is selected by these decoders. At the same time, the data W00 to W03 that are held in the data buffer 2 are sent to the I/O controller, and are written into the specific address of the memory array. At the same time, the write data W10 to W13 and the addresses A10 to A1n that are held in the data buffer 1 and the address buffer 1 are transferred to the data buffer 2 and the address buffer 2 respectively. These data and addresses are held in these buffers until when the next write command is input. Following this operation, write data W20 to W23 that are input in the present cycle are held in the data buffer 1, and corresponding addresses A20 to A2n are sent to the address buffer 2, and are held until when the next write command is input. As explained above, when the write data for the two past write cycles are held, the write data can be transferred to the memory array at the same time as the enabling of the specific address. Consequently, the write data can be written into the sense amplifier before sensing.

The read operation will be explained next. FIG. 16 illustrates the input of a read command and an address after the write command W2. The input addresses A30 to A3n are transferred to the address comparator and the multiplexer MUX shown in FIG. 15, and are compared with the addresses held in the address buffer 1 and the address buffer 2. When the addresses do not match with each other as a result of the comparison, a specific address of the memory array is enabled. Read data R30 to R33 that are read from this address are transferred to the output buffer, and are output to the outside. On the other hand, as shown in a read command R2 in FIG. 16, when addresses that are the same as the addresses A10 to A1n held in the address buffer 1 are input, a match signal HIT1 is output from the address comparator. The data multiplexer receives this match signal, and transfers the held data W10 to W1n to the output buffer from the data buffer 1 corresponding to the coincided address. The data multiplexer outputs the data to the outside as output data R10 to R1n. When the input address is held in the address buffer 2, a match signal HIT2 is output from the address comparator. The data multiplexer receives this match signal, and transfers the held data to the output buffer from the data buffer 2 corresponding to the coincided address. The data multiplexer outputs the data to the outside as output data. When the data in the address buffer 1 and the address buffer 2 match with each other, the data in the data buffer 1 corresponding to the address buffer 1 becomes valid in the output buffer, and this data is output to the outside.

Advantages of the present arrangement will be explained next. When the read and write cycle times as shown in FIG. 16 are short, or when the write data that is input in the write cycle is superimposed with the command input of the next cycle, or when the write data like the late write is input after the write command, it is difficult to write the data into the memory cell in the same cycle as the input cycle. Further, when two write cycles last, the last data of the burst is input in the middle of the next cycle. Therefore, when the data is transferred to and written into the array in the next cycle, the write time is short. Therefore, the write voltage falls. In the present arrangement, each time when the write command is input, the data is transferred to the next stage following the two addresses and two data buffers. The data is actually transferred to the memory array after the second write cycle. Accordingly, the write data can be transferred to the sense amplifier before sensing. Consequently, the write before sense operation can be achieved sufficiently. As sufficient write time can be secured, sufficient write characteristics can be obtained.

Figure 17:
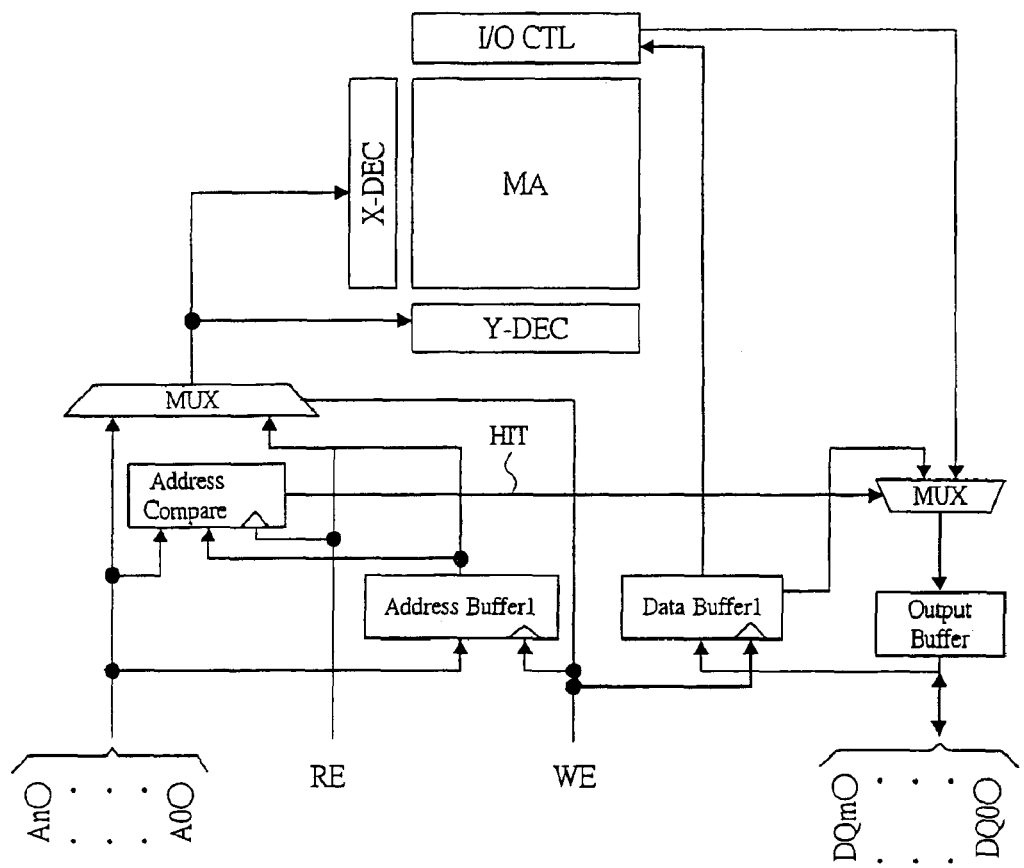
FIG. 17 is a block diagram of a DRAM to which the present invention is applied.
Figure 18:
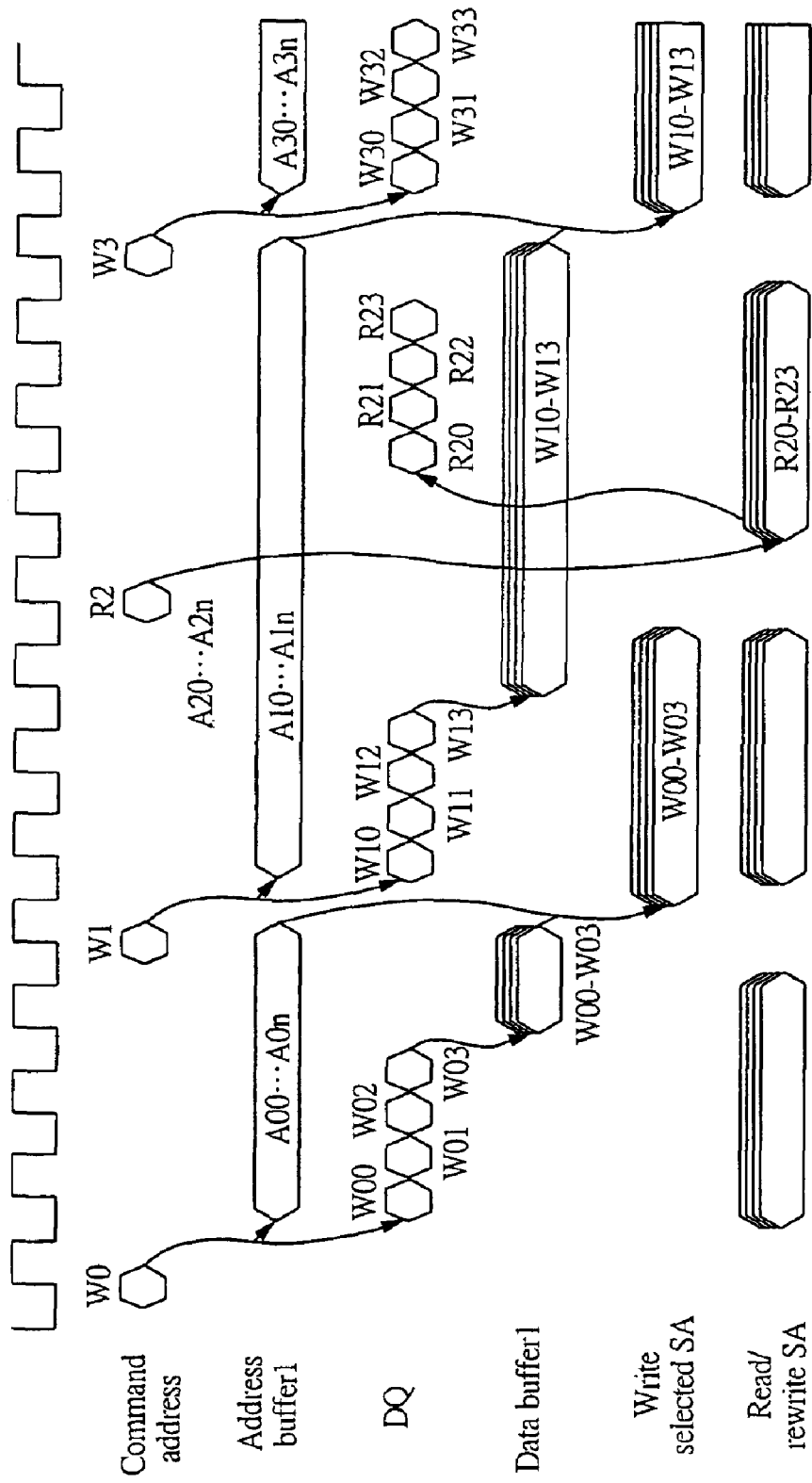
FIG. 18 is an illustration of the operation of the DRAM shown in FIG. 16.

Another total semiconductor device to which the present invention is applied will be explained with reference to FIG. 17 and FIG. 18. In the arrangement shown in FIG. 15 and. FIG. 16, the external buffer of the memory array holds two write data and two addresses. On the other hand, according to the arrangement shown in FIG. 17 and FIG. 18, the buffer has only one write data and one address. When the read and write cycle times are sufficiently shorter than the command input interval as compared with the above arrangement, the address and the data can be controlled more easily in the present arrangement. When the write command is input, corresponding addresses A00 to A0n are input at the same time. In a late write operation, write data W00 to W03 are input at a timing of one clock delayed. The write data W00 to W03 and the corresponding addresses A00 to A0n are held in the data buffer 1 and the address buffer 1 respectively until when the next write command is input. As shown in FIG. 18, when a write command W1 is input in the following cycle, the addresses A00 to A0n that are held in the address buffer 1 are transferred from the multiplexer MUX to the X decoder and the Y decoder. These decoders select a specific address. At the same time, the data W00 to W03 that are held in the data buffer 1 are sent to the I/O controller, and are written into the specific address of the memory array. Write data W10 to W13 that are input in the present cycle are held in the data buffer 1, and corresponding addresses A10 to A1n are sent to the address buffer 1, and are-held until when the next write command is input. As explained above, when the write data for the one past write cycle are held, the write data can be transferred to the memory array at the same time as the enabling of the specific address. Consequently, the write data can be written into the sense amplifier before sensing.

The read operation will be explained next. FIG. 18 illustrates the input of a read command and an address after the write command W1. The input addresses A20 to A2n are transferred to the address comparator and the multiplexer MUX shown in FIG. 17, and are compared with the addresses held in the address buffer 1. When the addresses do not match with each other as a result of the comparison, a specific address of the memory array is enabled. Read data R00 to R03 that are read from this address are transferred to the output buffer, and are output to the outside. On the other hand, when the addresses match with each other, a match signal HIT is enabled. The data held in the data buffer 1 are transferred to the output buffer, and the data are output to the outside, as shown in FIG. 15 and FIG. 16.

Advantages of the present arrangement will be explained next. It is preferable that the present arrangement is applied to an array having a relatively long cycle time during which the data input/output ends. The address buffer and the data buffer are provided at one stage, and the data are written into the sense amplifier before sensing in the next write cycle. With this arrangement, sufficient time can be taken to write data into the memory, as compared with the system of writing data within the same cycle. Therefore, the write-unselected memory cell rewrite voltage and the write-selected memory cell write voltage can be made equal. Sufficient write voltage can be obtained, and a high-speed write cycle can be realized. As compared with the arrangement shown in FIG. 15 and FIG. 16, the present arrangement has an advantage in that the internal structure can be simplified.

Preferred voltage condition of the semiconductor device to which the present invention is applied will be explained. The external voltage is about 2.5V or 1.8 or 1.5V. The array voltage VDL and the supply voltage VCL for peripheral circuit may be the same as the external voltage VDD, or may be lowered by a voltage down converter. The reduction in voltage has an advantage in that power consumption is reduced. Particularly when the array voltage VDL is lowered, the charge and discharge power of the data line can be reduced, which is effective for low power consumption. When the power is low, the word line amplitude voltage VPP can also be reduced. This has an advantage in that room is generated in the withstand voltage of the memory cell transistor. When the data line precharge level VDLR is one half of the array voltage, signal quantities of the "H" and "L" levels become uniform, which is preferable. Further, the current consumption due to the charge and discharge current of the data line can be reduced. When the two-cell/bit array is used, the generated signal quantity becomes two times that of a general one-cell/bit array. Therefore, this array is suitable for a low array voltage of 1V or below, for example. As compared with the one-cell/bit array, the two-cell/bit array stores one bit as complementary. Therefore, even when the precharge level of the data line is set to any level between the low voltage level VSS and the high voltage level VDL, a signal appears on the data line pair. Accordingly, when the precharge level is set to the high voltage level VDL, the amplification speed of the sense amplifier can be improved. When the array voltage is lowered, in a general DRAM array, the write speed of the opposite data writing cell is lowered. In the high-speed cycle, the write voltage becomes low. Therefore, the low array voltage has a problem in that the data holding time is reduced. On the other hand, according to the present arrangement, even when the voltage is low, it is possible to make small a difference between the write time on the rewriting cell and the write time on the write-selected cell. Therefore, there is a small difference between the write voltages. Consequently, even when the write cycle is increased at a low voltage, it is possible to avoid the shortening of the data holding time due to the aggravation of the write characteristics. As a result, the present arrangement is suitable for high-speed operation at a low voltage.

While the arrangement is explained for a DRAM, the present arrangement can also be applied to an embedded DRAM or the array portion of an embedded memory. The embedded memory has substantially no limit to the number of pins between the logic portion and the memory portion. Therefore, a large quantity of data can be collectively transferred to the memory array at the same time as or immediately after the write command. Accordingly, the present arrangement has an advantage in that the write cycle speed can be increased. Further, in the embedded memory, the operation can be carried out at any timing. Therefore, the write data can be input at the same time as the write command or before the write command. Consequently, based on the present arrangement, the write cycle speed can be increased while preventing the read cell from being badly affected.

The present invention can prevent the pre-sense operation of the unselected sense amplifier in the write before sense operation due to the speed up of the write operation. The present invention can also prevent the incomplete initialization of the sense amplifier due to the penetrating current in the two-cell/bit array.

What is claimed is:

1. A semiconductor device comprising:
   a plurality of word lines;
   a plurality of data line pairs;
   a plurality of memory cells provided at the intersections between the plurality of word lines and the plurality of data line pairs;
   the plurality of data line pairs including a first data line pair connected to a first data input/output line pair by a first select line and a second data line pair connected to the first data input/output line pair by a second select line;
   a first sense amplifier connected to the first data line pair;
   a second sense amplifier connected to the second data line pair;
   a first switch comprising a first MISFET (metal insulator semiconductor field effect transistor) that is controlled by a first control line, and that is connected to a first node of the first sense amplifier to supply a first power source to the first sense amplifier; and
   a second switch comprising a second MISFET that is controlled by the first control line, and that is connected to a second node of the second sense amplifier to supply the first power source to the second sense amplifier, wherein
   the first node and the second node are electrically isolated from each other, and
   at the time of writing data from the first data input/output line pair to the first data line pair, the first select line is enabled earlier than the first control line.

2. The semiconductor device according to claim 1, further comprising:
   a third sense amplifier connected to the first data line pair;
   a fourth sense amplifier connected to the second data line pair;
   a third switch comprising a third MISFET that is controlled by a second control line, and that is connected to a third node of the third sense amplifier to supply a second power source to the third sense amplifier; and
   a fourth switch consisting of a fourth MISFET that is controlled by the second control line, and that is connected to a fourth node of the fourth sense amplifier to supply the second power source to the fourth sense amplifier, wherein
   the plurality of word lines extend in a first direction, and the plurality of data line pairs extend in a second direction,
   the first and second sense amplifiers have a first conductive MISFET pair respectively,
   the third and fourth sense amplifiers have a second conductive MISFET pair respectively, and
   the third node and the fourth node are electrically isolated from each other.

3. The semiconductor device according to claim 1, further comprising:
   a fifth MISFET that has a source and drain route between one data line of the first data line pair and one data input/output line of the first data input/output line pair, and a sixth MISFET that has a source and drain route between the other data line of the first data line pair and the other data input/output line of the first data input/output line pair, gates of the MISFETs being controlled by the first select line; and a first output amplifier connected to the first data line pair, wherein the first output amplifier comprises a seventh MISFET that has a source and drain route connected to a source and drain route of the fifth MISFET, an eighth MISFET that has a source and drain route connected to a source and drain route of the sixth MISFET, a ninth MISFET having the gate connected to one data line of the first data line pair and having the drain connected to a connection point between the drain of the sixth MISFET and the source of the eighth MISFET, and a tenth MISFET having the gate connected to the other data line of the first data line pair and having the drain connected to a connection point between the drain of the fifth MISFET and the source of the seventh MISFET, the MISFETS being controlled by a third control line respectively.

4. The semiconductor device according to claim 3, further comprising:

an eleventh MISFET that has a source and drain route between one data line of the second data line pair and one data input/output line of the first data input/output line pair, and a twelfth MISFET that has a source and drain route between the other data line of the second data line pair and the other data input/output line of the first data input/output line pair, gates of the MISFETs being controlled by the second select line;

a second output amplifier connected to the second data line pair, a fifth switch controlled by a fourth control line and supplying a third power source to the first output amplifier connected to a fifth node; and a sixth switch controlled by the fourth control line and supplying the third power source to the second output amplifier connected to a sixth node, wherein the second output amplifier comprises a thirteenth MISFET that has a source and drain route connected to a source and drain route of the eleventh MISFET, a fourteenth MISFET that has a source and drain route connected to a source and drain route of the twelfth MISFET, a fifteenth MISFET having the gate connected to one data line of the second data line pair and having the drain connected to a connection point between the drain of the twelfth MISFET and the source of the fourteenth MISFET, and a sixteenth MISFET having the gate connected to the other data line of the second data line pair and having the drain connected to a connection point between the drain of the eleventh MISFET and the source of the thirteenth MISFET, the MISFETS being controlled by the third control line respectively, and the fifth node and the sixth node being electrically isolated from each other.

5. The semiconductor device according to claim 1, wherein the plurality of data line pairs include a plurality of the first data line pairs that are controlled by the first select line, and a plurality of the first sense amplifiers connected respectively to the first data line pairs share the first switch, and the memory cells connected to the first sense amplifiers have a MISFET and a capacitor respectively.

6. The semiconductor device according to claim 1, wherein the first data line pair connected to the first sense amplifier comprises complementary two lines that are connected with the memory cells, and the memory cells have a MISFET and a capacitor respectively.

7. The semiconductor device according to claim 2, wherein the first sense amplifier and the third sense amplifier, and the second sense amplifier and the fourth sense amplifier constitute positive feedback amplifiers respectively.

8. A semiconductor device comprising:

a plurality of word lines;

a plurality of data line pairs;

a plurality of memory cells that are provided at the intersections between the plurality of word lines and the plurality of data line pairs;

the plurality of data line pairs including a first data line pair connected to a first data input/output line pair by a first select line, and a second data line pair connected to the first data input/output line pair by a second select line;

a first sense amplifier connected to the first data line pair;

a second sense amplifier connected to the second data line pair;

a first switch comprising a first MISFET (metal insulator semiconductor field effect transistor) that is controlled by a first control line, and that is connected to a first node of the first sense amplifier to supply a first power source to the first sense amplifier; and a second switch comprising a second MISFET that is controlled by the first control line, and that is connected to a second node of the second sense amplifier to supply the first power source to the second sense amplifier, wherein when the word lines are enabled, data are read out to all the plurality of data line pairs, and the first node and the second node are electrically isolated from each other.

9. The semiconductor device according to claim 8, further comprising:

a third sense amplifier connected to the first data line pair;

a fourth sense amplifier connected to the second data line pair;

a third switch comprising a third MISFET that is controlled by a second control line, and that is connected to a third node of the third sense amplifier to supply a second power source to the third sense amplifier; and a fourth switch consisting of a fourth MISFET that is controlled by the second control line, and that is connected to a fourth node of the fourth sense amplifier to supply the second power source to the fourth sense amplifier, wherein the first and second sense amplifiers have a first conductive MISFET pair respectively, the third and fourth sense amplifiers have a second conductive MISFET pair respectively, the plurality of word lines extend in a first direction, and the plurality of data line pairs extend in a second direction, and the third node and the fourth node are electrically isolated from each other.

10. The semiconductor device according to claim 8, further comprising:

a fifth MISFET that has a source and drain route between one data line of the first data line pair and one data input/output line of the first data input/output line pair, and a sixth MISFET that has a source and drain route between the other data line of the first data line pair and the other data input/output line of the first data input/output line pair, gates of the MISFETs being controlled by the first select line; and a first output amplifier connected to the first data line pair, wherein the first output amplifier comprises a seventh MISFET that has a source and drain route connected to a source and drain route of the fifth MISFET, an eighth MISFET that has a source and drain route connected to a source and drain route of the sixth MISFET, a ninth MISFET having the gate connected to one data line of the first data line pair and having the drain connected to a connection point between the drain of the sixth MISFET and the source of the eighth MISFET, and a tenth MISFET having the gate connected to the other data line of the first data line pair and having the drain connected to a connection point between the drain of the fifth MISFET and the source of the seventh MISFET, the MISFETS being controlled by a third control line respectively.

11. The semiconductor device according to claim 10, further comprising:

an eleventh MISFET that has a source and drain route between one data line of the second data line pair and one data input/output line of the first data input/output line pair, and a twelfth MISFET that has a source and drain route between the other data line of the second data line pair and the other data input/output line of the first data input/output line pair, gates of the MISFETs being controlled by the second select line;

a second output amplifier connected to the second data line pair, a fifth switch controlled by a fourth control line and supplying a third power source to the first output amplifier connected to a fifth node; and a sixth switch controlled by the fourth control line and supplying the third power source to the second output amplifier connected to a sixth node, wherein the second output amplifier comprises a thirteenth MISFET that has a source and drain route connected to a source and drain route of the eleventh MISFET, a fourteenth MISFET that has a source and drain route connected to a source and drain route of the twelfth MISFET, a fifteenth MISFET having the gate connected to one data line of the second data line pair and having the drain connected to a connection point between the drain of the twelfth MISFET and the source of the fourteenth MISFET, and a sixteenth MISFET having the gate connected to the other data line of the second data line pair and having the drain connected to a connection point between the drain of the eleventh MISFET and the source of the thirteenth MISFET, the MISFETS being controlled by the third control line respectively, and the fifth node and the sixth node being electrically isolated from each other.

12. A semiconductor device comprising:

a memory array, said memory including:
  a first address latch for holding a first write address which is input according to a first write command;
  a first write data latch for holding a first write data which is input according to the first write command; and
  a first sub-memory array;
the first sub-memory array having;
  a plurality of word lines extending in a first direction;
  a plurality of data pair lines extending in a second direction; and
  a plurality of memory cells;
the plurality of data line pairs including:
  a first data line pair that is selected by a first select line corresponding to the first write address; and
  a second data line pair that is selected by a second select line;
a first sense amplifier comprised of a first conductive MISFET pair provided in the first data line pair;
a second sense amplifier provided adjacent to the first sense amplifier and comprised of the first conductive MISFET pair provided in the second data line pair;
a first switch comprising the first conductive MISFET controlled by a first control line and connected to a first node of the first sense amplifier to supply a first power source to the first sense amplifier; and
a second switch comprising the first conductive MISFET controlled by the first control line and connected to a second node of the second sense amplifier to supply the first power source to the second sense amplifier, wherein
the first node and the second node are electrically isolated from each other, and
a first word line corresponding to the first write address is selected according to a second write command that is input after the first write command, and the first write data is transferred to the first sense amplifier.

13. The semiconductor device according to claim 12, wherein
the plurality of memory cells have a MISFET and a capacity respectively,
a second write address that is input according to the second write command is transferred to the first address latch, and
a second write data that is input according to the second write command is transferred to the first write data latch.

14. The semiconductor device according to claim 12, further comprising:

a fifth MISFET that has a source and drain route between one data line of the first data line pair and one data input/output line of a first data input/output line pair, and a sixth MISFET that has a source and drain route between the other data line of the first data line pair and the other data input/output line of the first data input/output line pair, gates of the MISFETs being controlled by the first select line; and a first output amplifier connected to the first data line pair, wherein the first output amplifier comprises a seventh MISFET that has a source and drain route connected to a source and drain route of the fifth MISFET, an eighth MISFET that has a source and drain connected to a source and drain route of the sixth MISFET, a ninth MISFET having the gate connected to one data line of the first data line pair and having the drain connected to a connection point between the drain of the sixth MISFET and the source of the eighth MISFET, and a tenth MISFET having the gate connected to the other data line of the first data line pair and having the drain connected to a connection point between the drain of the fifth MISFET and the source of the seventh MISFET, the MISFETS being controlled by a third control line respectively.

15. The semiconductor device according to claim 14, further comprising:
an eleventh MISFET that has a source and drain route between one data line of the second data line pair and one data input/output line of the first data input/output line pair, and a twelfth MISFET that has a source and drain route between the other data line of the second data line pair and the other data input/output line of the first data input/output line pair, gates of the MISFETs being controlled by the second select line;
a second output amplifier connected to the second data line pair,
a fifth switch controlled by a fourth control line and supplying a third power source to the first output amplifier connected to a fifth node; and
a sixth switch controlled by the fourth control line and supplying the third power source to the second output amplifier connected to a sixth node, wherein
the second output amplifier comprises a thirteenth MISFET that has a source and drain route connected to a source and drain route of the eleventh MISFET, a fourteenth MISFET that has a source and drain route connected to a source and drain route of the twelfth MISFET, a fifteenth MISFET having the gate connected to one data line of the second data line pair and having the drain connected to a connection point between the drain of the twelfth MISFET and the source of the fourteenth MISFET, and a sixteenth MISFET having the gate connected to the other data line of the second data line pair and having the drain connected to a connection point between the drain of the eleventh MISFET and the source of the thirteenth MISFET, the MISFETS being controlled by the third control line respectively, and the fifth node and the sixth node being electrically isolated from each other.

16. The semiconductor device according to claim 12, wherein
when the first word line is selected, memory cells are connected to the first and second data line pairs.

17. A semiconductor device comprising:
a memory array including:
a first address latch for holding a first write address which is input according to a first write command;
a first write data latch for holding a first write data which is input according to the first write command;
a second address latch for holding a second write address which is input according to a second write command that is input after the first write command;
a second write data latch for holding a second write data which is input according to the second write command; and
a first sub-memory array;
the first sub-memory array having:
a plurality of word lines extending in a first direction;
a plurality of data pair lines extending in a second direction; and
a plurality of memory cells;
the plurality of data line pairs including:
a first data line pair that is selected by a first select line corresponding to the first write address; and
a second data line pair that is selected by a second select line;
a first sense amplifier comprised of a first conductive MISFET pair provided in the first data line pair;
a second sense amplifier provided adjacent to the first sense amplifier and that comprised of the first conductive MISFET pair provided in the second data line pair;
a first switch comprising the first conductive MISFET is controlled by a first control line and connected to a first node of the first sense amplifier to supply a first power source to the first sense amplifier; and
a second switch comprising the first conductive MISFET controlled by the first control line and connected to a second node of the second sense amplifier to supply the first power source to the second sense amplifier, wherein
the first node and the second node are electrically isolated from each other, and
a first word line corresponding to the first write address is selected according to a second write command that is input after the first write command, and the first write data is transferred to the first sense amplifier.

18. The semiconductor device according to claim 17, wherein
in accordance with the third write command, the second write address is transferred to the first address latch, the second write data is transferred to the first write data latch, a third write address that is input according to the third write command is transferred to the second address latch, and a third write data that is input according to the third write command is transferred to the second write data latch.

19. The semiconductor device according to claim 17, further comprising:
a fifth MISFET that has a source and drain route between one data line of the first data line pair and one data input/output line of a first data input/output line pair, and a sixth MISFET that has a source and drain route between the other data line of the first data line pair and the other data input/output line of the first data input/output line pair, gates of the MISFETs being controlled by the first select line; and
a first output amplifier connected to the first data line pair, wherein
the first output amplifier comprises a seventh MISFET that has a source and drain route connected to a source and drain route of the fifth MISFET, an eighth MISFET that has a source and drain route connected to a source and drain route of the sixth MISFET, a ninth MISFET having the gate connected to one data line of the first data line pair and having the drain connected to a connection point between the drain of the sixth MISFET and the source of the eighth MISFET, and a tenth MISFET having the gate connected to the other data line of the first data line pair and having the drain connected to a connection point between the drain of the fifth MISFET and the source of the seventh MISFET, the MISFETS being controlled by a third control line respectively.

20. The semiconductor device according to claim 19, further comprising:
an eleventh MISFET that has a source and drain route between one data line of the second data line pair and one data input/output line of the first data input/output line pair, and a twelfth MISFET that has a source and drain route between the other data line of the second data line pair and the other data input/output line of the first data input/output line pair, gates of the MISFETs being controlled by the second select line;

a second output amplifier connected to the second data line pair, a fifth switch controlled by a fourth control line and supplying a third power source to the first output amplifier connected to a fifth node; and a sixth switch controlled by the fourth control line and supplying the third power source to the second output amplifier connected to a sixth node, wherein the second output amplifier comprises a thirteenth MISFET that has a source and drain route connected to a source and drain route of the eleventh MISFET, a fourteenth MISFET that has a source and drain route connected to a source and drain route of the twelfth MISFET, a fifteenth MISFET having the gate connected to one data line of the second data line pair and having the drain connected to a connection point between the drain of the twelfth MISFET and the source of the fourteenth MISFET, and a sixteenth MISFET having the gate connected to the other data line of the second data line pair and having the drain connected to a connection point between the drain of the eleventh MISFET and the source of the thirteenth MISFET, the MISFETS being controlled by the third control-line respectively, and the fifth node and the sixth node being electrically isolated from each other.

21. The semiconductor device according to claim 17, wherein when the first word line is selected, memory cells are connected to the first and second data line pairs.

22. A semiconductor device comprising:

a circuit for holding an address;

a circuit for holding data;

a memory array including:
   a plurality of word lines extending in a first direction;
   a plurality of data line pairs extending in a second direction; and
   a plurality of memory cells;

a first sense amplifier having a first conductive MISFET pair connected to a first data line pair among the plurality of data line pairs;

a second sense amplifier having the first conductive MISFET pair provided in the second data line pair among the plurality of data line pairs;

a first switch having the first conductive MISFET controlled by a first control line and connected to a first node of the first sense amplifier to supply a first power source to the first sense amplifier; and a second switch having the first conductive MISFET controlled by the first control line and connected to a second node of the second sense amplifier to supply the first power source to the second sense amplifier, wherein the first and second sense amplifiers are provided adjacently, a first address is input according to a first write command, a word line corresponding to a second address held in the address holding circuit is enabled by the first write command, a data held in the data holding circuit is transferred to the first data line pair corresponding to a second address, and the first node and the second node are electrically isolated from each other.

23. The semiconductor device according to claim 22, further comprising:

a third sense amplifier having a second conductive MISFET pair connected to the first data line pair;

a fourth sense amplifier having the second conductive MISFET pair connected to the second data line pair;

a third switch controlled by a second control line and connected to a third node of the third sense amplifier to supply a second power source to the third sense amplifier; and a fourth switch controlled by the second control line and connected to a fourth node of the fourth sense amplifier to supply the second power source to the fourth sense amplifier, wherein a first data to be written into a memory cell corresponding to a first address is input according to the first write command, and the third node and the fourth node are electrically isolated from each other.

24. A semiconductor device comprising:

a plurality of word lines;

a plurality of data line pairs;

a plurality of dynamic memory cells;

the plurality of data line pairs including a first data line pair connected to a first data input/output line pair by a first select line, and a second data line pair connected to the first data input/output line pair by a second select line;

a first sense amplifier that is connected to the first data line pair;

a second sense amplifier that is connected to the second data line pair;

a first switch comprising a first MISFET controlled by a first control line and connected to a first node of the first sense amplifier to supply a first power source to the first sense amplifier; and a second switch comprising a second MISFET controlled by the first control line and connected to a second node of the second sense amplifier to supply the first power source to the second sense amplifier, wherein the first data line pair comprises complementary first and second data lines, the first and second data lines being connected with memory cells respectively, the second data line pair comprises complementary third and fourth data lines, the third and fourth data lines being connected with memory cells respectively, and the first node and the second node are electrically isolated from each other.

25. The semiconductor device according to claim 24, wherein the memory cells connected to the first data line have a third MISFET and a capacitor connected to the third MISFET, the gate of the third MISFET being connected to a first word line among a plurality of word lines, and a source and drain route of the third MISFET being connected to the first data line, and the memory cells connected to the second data line have a fourth MISFET and a capacitor connected to the fourth MISFET, the gate of the fourth MISFET being connected to the first word line, and a source and drain route of the fourth MISFET being connected to the second data line.

26. The semiconductor device according to claim 25, wherein a plurality of first data line pairs are selected according to the first select line;

a plurality of second data line pairs are selected according to the second select line;

a plurality of first sense amplifiers connected to the plurality of first data line pairs share a first switch; and a plurality of second sense amplifiers connected to the plurality of second data line pairs share a second switch.

* * * * *